(12) United States Patent
Eguchi et al.

(10) Patent No.: US 6,495,054 B1
(45) Date of Patent: Dec. 17, 2002

(54) ETCHING METHOD AND CLEANING METHOD OF CHEMICAL VAPOR GROWTH APPARATUS

(75) Inventors: Kazuhiro Eguchi, Chigasaki (JP); Katsuya Okumura, Yokohama (JP); Masahiro Kiyotoshi, Sagamihara (JP); Katsuhiko Hieda, Yokohama (JP); Soichi Yamazaki, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/429,074

(22) Filed: Oct. 29, 1999

(30) Foreign Application Priority Data

Oct. 30, 1998 (JP) ............................................ 10-311323
Oct. 20, 1999 (JP) ............................................ 11-298271

(51) Int. Cl.$^7$ ............................................... C03C 15/00
(52) U.S. Cl. ....................... 216/58; 216/6.3; 134/1.1; 438/3; 438/742
(58) Field of Search .................... 438/3, 722, 742; 216/76, 58, 63, 64; 134/1.1, 1.2

(56) References Cited

U.S. PATENT DOCUMENTS

| | | | | |
|---|---|---|---|---|
| 5,658,820 A | * | 8/1997 | Chung | .............................. 438/3 |
| 5,840,200 A | * | 11/1998 | Nakagawa et al. | ............. 216/6 |
| 5,849,207 A | * | 12/1998 | Sato | .............................. 216/76 |
| 6,095,085 A | * | 8/2000 | Agarwal | ............... 118/723 ER |
| 6,177,351 B1 | * | 1/2001 | Beratan et al. | .............. 438/694 |

FOREIGN PATENT DOCUMENTS

| JP | 8-124904 | 5/1996 |
|---|---|---|
| JP | 10-335318 | 12/1998 |

* cited by examiner

*Primary Examiner*—Gregory Mills
*Assistant Examiner*—Luz Alejandro
(74) *Attorney, Agent, or Firm*—Finnegan, Henderson, Farabow, Garrett & Dunner, L.L.P.

(57) ABSTRACT

Presented is an etching method capable of easily etching an oxide containing an alkaline-earth metal. One method is to etch the oxide by using an etching gas containing a halogen gas except for fluorine, an interhalogen compound consisting of only a halogen element except for fluorine, or a halogen hydride consisting of a halogen element except for fluorine and hydrogen. Particularly chlorides, bromides, and iodides of alkaline-earth metals have relatively high vapor pressures, so a thin film containing an alkaline-earth metal can be etched by using chlorine gas, bromine gas, or iodine gas. When a halogen gas containing fluorine is used, damages to $SiO_2$ portions used in a film formation apparatus are prevented by coating these $SiO_2$ portions with a fluoride of an alkaline-earth metal.

2 Claims, 13 Drawing Sheets

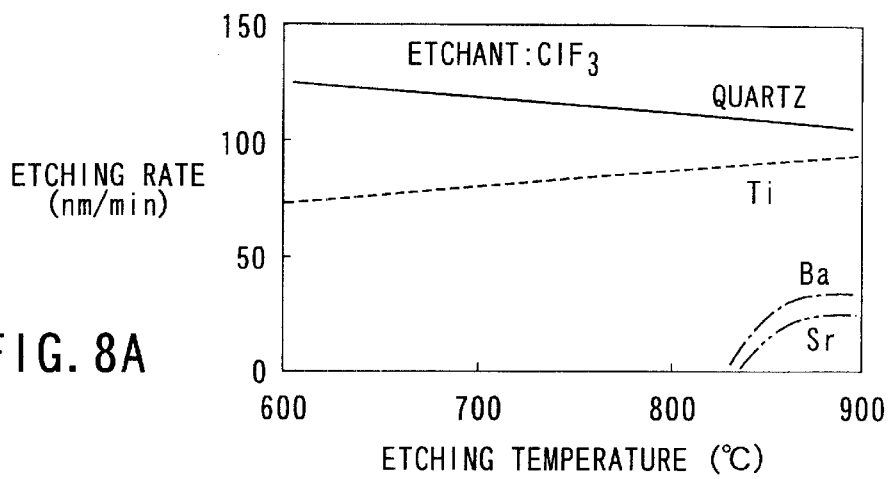

FIG. 8A

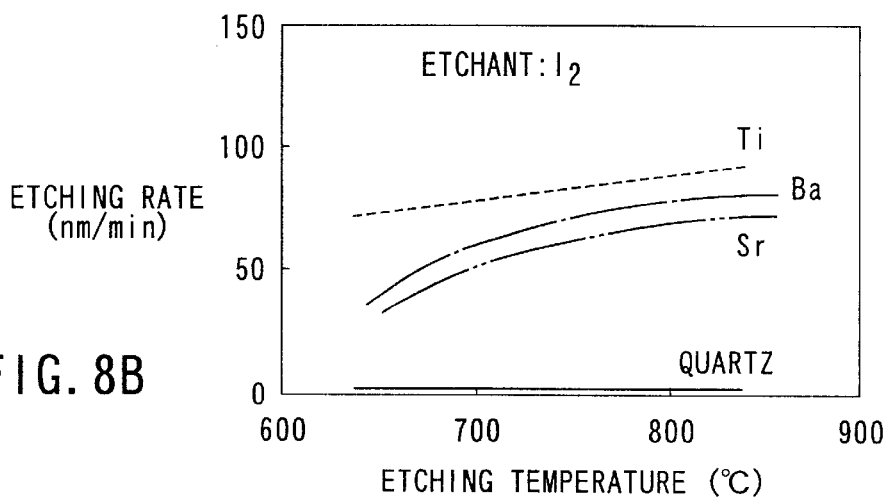

FIG. 8B

| TEMPER-ATURE (°C) | VAPOUR PRESSURE (Torr) | | | | | |
|---|---|---|---|---|---|---|
| | $BaCl_2$ | $BaBr_2$ | $BaI_2$ | $SrCl_2$ | $SrBr_2$ | $SrI_2$ |
| 500 | $1 \times 10^{-8}$ | $8 \times 10^{-8}$ | $1 \times 10^{-7}$ | $8 \times 10^{-10}$ | $6 \times 10^{-9}$ | $8 \times 10^{-9}$ |
| 600 | $1 \times 10^{-6}$ | $8 \times 10^{-8}$ | $1 \times 10^{-5}$ | $1 \times 10^{-7}$ | $8 \times 10^{-7}$ | $1 \times 10^{-6}$ |
| 700 | $3 \times 10^{-5}$ | $2 \times 10^{-4}$ | $4 \times 10^{-4}$ | $6 \times 10^{-6}$ | $5 \times 10^{-5}$ | $7 \times 10^{-5}$ |
| 800 | $5 \times 10^{-4}$ | $4 \times 10^{-3}$ | $4 \times 10^{-3}$ | $2 \times 10^{-4}$ | $2 \times 10^{-3}$ | $3 \times 10^{-3}$ |
| 900 | $6 \times 10^{-3}$ | $5 \times 10^{-2}$ | $7 \times 10^{-2}$ | $3 \times 10^{-3}$ | $2 \times 10^{-2}$ | $4 \times 10^{-2}$ |

FIG. 9

| ETCHING GAS | | Ar GAS FLOW RATE (sccm) | PLASMA EXCITION (13.6MHz, 150W) | CHAMBER PRESSURE (Torr) | ETCHING TEMPERATURE (°C) | BST FILM ETCHING STATUS | SiO2 DAMAGE STATUS |
|---|---|---|---|---|---|---|---|
| GAS TYPE | FLOW RATE (sccm) | | | | | | |
| ClF3 | 50 | 50 | WITHOUT | 1 | 850 | Ba, Sr REMAINED | DAMAGED |
| I2 | 50 | 50 | WITHOUT | 1 | 700 | FULLY ETCHED | NOT DAMAGED |
| I2 | 50 | 50 | WITH | 1 | 600 | FULLY ETCHED | NOT DAMAGED |
| Cl2 | 50 | 50 | WITHOUT | 1 | 800 | FULLY ETCHED | NOT DAMAGED |
| Cl2 | 50 | 50 | WITH | 1 | 700 | FULLY ETCHED | NOT DAMAGED |
| Br2 | 50 | 50 | WITHOUT | 1 | 700 | FULLY ETCHED | NOT DAMAGED |
| Br2 | 50 | 50 | WITH | 1 | 600 | FULLY ETCHED | NOT DAMAGED |
| HCl | 50 | 50 | WITHOUT | 1 | 800 | FULLY ETCHED | NOT DAMAGED |
| HCl | 50 | 50 | WITH | 1 | 700 | FULLY ETCHED | NOT DAMAGED |
| HBr | 50 | 50 | WITHOUT | 1 | 700 | FULLY ETCHED | NOT DAMAGED |
| HBr | 50 | 50 | WITH | 1 | 600 | FULLY ETCHED | NOT DAMAGED |
| HI | 50 | 50 | WITHOUT | 1 | 700 | FULLY ETCHED | NOT DAMAGED |
| HI | 50 | 50 | WITH | 1 | 600 | FULLY ETCHED | NOT DAMAGED |
| BrCl | 50 | 50 | WITHOUT | 1 | 600 | FULLY ETCHED | NOT DAMAGED |
| ICl | 50 | 50 | WITHOUT | 1 | 600 | FULLY ETCHED | NOT DAMAGED |
| IBr | 50 | 50 | WITHOUT | 1 | 600 | FULLY ETCHED | NOT DAMAGED |

FIG. 10

| HEAT TREATMENT | | CONTENTS (mg/cm²) | | COMPOSITION (atomic%) | |
|---|---|---|---|---|---|
| | | Ca | F | Ca | F |
| NO HEAT-TREATMENT | | 12.0 | 8.6 | 38.6 | 61.4 |
| ClF₃ | 800°C | 10.6 | 8.3 | 38.5 | 63.5 |
| | 820°C | 11.7 | 8.3 | 38.6 | 61.4 |
| | 860°C | 11.4 | 7.5 | 40.6 | 59.4 |
| Ar | 860°C | 12.6 | 8.1 | 41.2 | 58.8 |

| ETCHING CONDITION | Ba ETCHING AMOUNT (%) | Sr ETCHING AMOUNT (%) | Ti ETCHING AMOUNT (%) |
|---|---|---|---|
| (1) | 100 | 100 | 100 |
| (2) | 100 | 100 | 100 |
| (3) | 0 | 0 | 100 |
| (4) | 100 | 100 | 5 |
| (5) | 0 | 0 | 100 |
| (6) | 100 | 100 | 7 |

ETCHING METHOD AND CLEANING METHOD OF CHEMICAL VAPOR GROWTH APPARATUS

BACKGROUND OF THE INVENTION

The present invention relates to an etching method of etching an oxide containing alkaline-earth metals as constituent elements, a chemical vapor growth apparatus for forming an oxide film containing alkaline-earth metals as constituent elements, and a cleaning method of the apparatus.

New materials that have not been conventionally used are beginning to be used in new semiconductor devices represented by very-large-scale semiconductor integrated circuits. So, chemical vapor deposition is beginning to be demanded to deposit thin films of these new materials. One of these new materials is barium strontium titanate ((Ba,Sr)$TiO_3$):BST which is a high-dielectric constant material used in a charge storage film (capacitive film) of a DRAM.

In the semiconductor device fabrication processes, dry etching superior in micro fabrication properties is widely used. However, alkali-earth metals such as Sr and Ba constructing the above material are not etched because the vapor pressure of a compound formed by a conventional etching gas is low.

Meanwhile, the semiconductor device fabrication processes extensively employ the formation of thin films by chemical vapor deposition (CVD) having high step coverage and capable of depositing in large areas. When a thin film is deposited by this CVD, a deposit sticks not only to a substrate for deposition but also to a reaction chamber exposed to a deposition gas or to jigs installed in the chamber. This deposit peels off owing to stress or mechanical stimulus, and the peeled dust particles fall on the substrate during deposition or during transfer of the substrate, thereby causing particle contamination of the formed thin film. Therefore, it is necessary to clean and remove the deposit, other than the objective deposit, sticking to the interior of the apparatus.

This cleaning method is desirably performed without disassembling the apparatus in order to raise the throughput. As this method of cleaning without disassembling the apparatus, a cleaning gas for changing the deposit into a substance having high vapor pressure is supplied into the apparatus to remove the deposit.

Unfortunately, alkaline-earth metals such as Sr and Ba constructing the aforementioned material cannot be removed because the vapor pressure of the compound formed by this conventional cleaning method is low.

A thin film containing alkaline-earth metals cannot be dry-etched and a chemical vapor deposition apparatus for depositing a thin film containing alkaline-earth metals cannot be cleaned with gas for the same reason: none of conventional etching gases and cleaning gases can form an alkaline-earth metal compound having high vapor pressure.

It is narrowly possible to etch a thin film containing alkaline-earth metals such as Ba and Sr by using chlorine trifluoride ($ClF_3$) gas. However, a high temperature of 800° C. or more is necessary for the etching, and yet the etching rate of Ba and Sr is lower than that of Ti.

Additionally, under severe conditions in which $ClF_3$ is used at high temperatures, the corrosiveness of $ClF_3$ increases. The most serious problem is that $SiO_2$ is also etched when $ClF_3$ is used at high temperatures. $SiO_2$ is frequently used as interlayer dielectrics and a surface protective film in semiconductor devices. These $SiO_2$-based films already formed are destroyed when a thin film containing alkaline-earth metals is dry-etched.

Also, a reaction chamber of a chemical vapor deposition apparatus is often made of quartz, and most jigs such as a substrate holder and a gas supply nozzle installed in the reaction chamber are made of quartz. Therefore, when a chemical vapor deposition apparatus for depositing a thin film containing alkaline-earth metals is cleaned by using a gas such as $ClF_3$, quartz is eroded especially at high temperatures, resulting in destruction of the apparatus.

As described above, when a gas containing a halogen such as fluorine is used as an etching gas or a cleaning gas, no alkaline-earth metal compound having high vapor pressure is formed. Consequently, etching or cleaning takes a long time and hence is difficult to perform.

Also, when a fluorine-containing gas is used to etch or clean a chemical vapor growth apparatus, $SiO_2$ is corroded, and this destroys an interlayer insulating film or the apparatus.

BRIEF SUMMARY OF THE INVENTION

It is an object of the present invention to provide an etching method capable of easily etching an oxide of an alkaline-earth metal.

It is another object of the present invention to provide an etching method which does not etch $SiO_2$-containing layers in a semiconductor device, or an etching method which etches a thin film containing an oxide film of an alkaline-earth metal without etching quartz members of a chemical vapor growth apparatus, and to provide a chemical vapor growth apparatus, and a cleaning method of the chemical vapor growth apparatus.

To achieve the above objects, an etching method of the present invention comprises the steps of preparing an oxide layer containing at least one type of alkaline-earth metal; and etching the oxide layer containing at least one type of alkaline-earth metal by using, as an etching gas, either a halogen gas other than fluorine gas, or a gas containing at least one material selected from the group consisting of an interhalogen compound consisting of halogen elements other than fluorine, and a halogen hydride consisting of a halogen element other than fluorine and hydrogen.

The step of etching the oxide layer desirably includes a step of etching in an ambient at not less than 500° C.

The step of etching the oxide layer desirably includes a step of etching the oxide layer while changing an etching temperature.

The step of etching the oxide layer may includes:
a first etching step having a first etching condition; and
a second etching step having a second etching condition, and
the etching temperature in the first etching step is different from the etching temperature in the second etching step.

The second etching step is preferably successively performed after the first etching step, and the etching temperature in the first etching step is lower than the etching temperature in the second etching step.

The etching method may further comprise a step of repeating a plurality of times the step of successively performing the first and the second step.

The step of etching the oxide layer above-mentioned preferably includes a step of etching using chlorine gas as the etching gas.

The step of etching the oxide layer preferably includes a step of using a gas activated by plasma excitation as the etching gas.

The oxide layer above-mentioned is preferably a (Ba,Sr)TiO$_3$ layer.

Chlorides, bromides, and iodides of alkaline-earth metals have relatively high vapor pressures. So, a thin film containing an alkaline-earth metal can be etched by using chlorine, bromine, or iodine. Also, since F highly corrosive for SiO$_2$ is not contained, SiO$_2$ portions used in a semiconductor device or in a film formation apparatus are not damaged. Therefore, dry etching using chlorine, bromine, and iodine gases can be effectively used as a cleaning means of a film formation apparatus. Additionally, the etching temperature can be lowered when active halogen radicals are formed by activating a halogen.

Particularly chlorides of alkaline-earth metals have relatively high vapor pressures, so alkaline-earth metals contained in a thin film can be etched at a high temperature of 700° C. or more. However, in the temperature range of 700° C. or more within which alkaline-earth metals can be etched, chlorides of metals such as titanium and tantalum evaporate and at the same time redeposit by thermal decomposition. This makes etching difficult to perform. A thin film containing a plurality of metals including alkaline-earth metals can be dry-etched by dividing the dry etching step into: a step of preferentially dry-etching metals whose chlorides thermally decompose to redeposit at high temperatures, and a step of preferentially dry-etching the alkaline-earth metals.

Also, by etching at a high temperature of about 800° C. after etching is performed using chlorine gas at a low temperature of about 500° C., metals other than alkaline-earth metals can be previously etched. This facilitates the etching at a high temperature of about 800° C., since the residual film contains only oxides of the alkaline-earth metals.

In particular, metals such as titanium, tantalum, and ruthenium whose chlorides decompose and redeposit at a temperature of 700° C. or more at which alkaline-earth metals can be etched are etched as fluorides in this temperature range by using an etching gas such as chlorine trifluoride. This makes two-stage etching feasible. Since etching of alkaline-earth metals and etching of metals other than the alkaline-earth metals can be performed at the same etching temperature, the etching can be performed within a short time period, and the etching gas consumption amount can be reduced. It is also possible to suppress film peeling caused by abrupt temperature changes during etching.

Furthermore, a thick film containing alkaline-earth metals can be etched by repeating an etching step of primarily etching alkaline-earth metals and an etching step of etching metals other than alkaline-earth metals. Since etching is done in stages, no perfect etching needs to be performed in the individual etching steps. This allows close temperatures such as 850° C. and 700° C. to be set as different etching temperatures. Accordingly, time loss resulting from etching temperature change can be reduced, and this shortens the etching time. By this shortening of the etching time, it is possible to suppress deterioration of an apparatus exposed to high-temperature exhaust gases and reduce the etching gas consumption amount.

Also, when etching is performed while the etching temperature is changed, a formed film containing alkaline-earth metals can be etched even in an apparatus having a reaction chamber whose etching temperature is difficult to abruptly change.

An etching method according to the second aspect of the present invention comprises the steps of preparing an oxide layer containing at least one type of alkaline-earth metal, and etching the oxide layer containing at least one type of alkaline-earth metal by using an etching gas composed of a gas containing a halogen element and a gas consisting of a halide of Ti.

The etching step desirably comprises the step of etching by using a gas containing at least fluorine as the gas containing a halogen element.

According to the second aspect of the present invention, even when Ti is selectively removed and no longer exists in an object to be cleaned, Ti is supplied from a gas. This produces halides such as Ba—Ti and Sr—Ti necessary to remove Ba and Sr. Consequently, perfect cleaning is possible.

Also, since halides of Ti have high vapor pressures, a gas amount containing Ti necessary for cleaning can be readily supplied. Additionally, since a halogen is also used as an etching gas, it does not interfere with etching.

A chemical vapor growth apparatus according to the third aspect of the present invention comprises a reaction chamber, a heating mechanism for heating the reaction chamber, a reaction gas supply unit connected to the reaction chamber to supply a reaction gas, a reaction gas exhaust unit connected to the reaction chamber to exhaust the reaction gas from the reaction chamber, and a member installed in the reaction chamber, wherein one of the reaction chamber and the member has a portion made of quartz, and at least a part of a surface of the quartz portion, which is exposed to the reaction gas, is coated with a fluoride of an alkaline-earth metal.

The portion of the quartz member, which is coated with a fluoride of an alkaline-earth metal is a portion to be exposed to a cleaning gas during cleaning of the apparatus.

Since fluorides of alkaline-earth metals have high resistance to a highly corrosive gas at high temperatures, damages to quartz members by a cleaning gas during cleaning can be suppressed.

Gas cleaning done by a CVD apparatus for a thin film containing alkaline-earth metals as constituent elements must be performed at high temperatures by using a highly corrosive gas. A protective film made from a fluoride of an alkaline-earth metal is particularly effective in cleaning.

Damages to quartz caused by a cleaning gas are especially remarkable when a cleaning gas containing fluorine is used. Hence, protection using a fluoride of an alkaline-earth metal is effective.

A cleaning method of a chemical vapor growth apparatus according to the fourth aspect of the present invention is a cleaning method of a hot wall type chemical vapor growth apparatus which uses a quartz member and deposits an oxide containing at least one type of alkaline-earth metal, comprising the steps of depositing a fluoride of an alkaline-earth metal at least on a surface of the quartz member, depositing the oxide on a substrate for deposition once or more, and etching the oxide by using an etching gas containing a fluorine compound.

The etching step desirably comprises the step of using a gas further containing a halide of Ti as the etching gas.

According to the fourth aspect of the present invention, a protective film is formed by using a gas as in normal CVD, so the apparatus need not be disassembled in the formation of the protective film. Since the protective film is formed, an etching gas containing, e.g., ClF$_3$ can be used. Even when the protective film deteriorates by repeated BST film formation and ClF$_3$ cleaning, the protective film can be re-formed without immediately disassembling the apparatus. This increases the availability and throughput of the apparatus.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 8A and 8B are graphs showing the dependence of the etching rate on temperature when $ClF_3$ and $I_2$ were used, respectively;

FIG. 9 is a diagram showing the relationships between the etching temperatures and the vapor pressures of various etching gases;

FIG. 10 is a diagram showing the relationships between various etching gases, etching conditions, BST film etching states, and quartz part etching (damage) results;

DETAILED DESCRIPTION OF THE INVENTION

Embodiments of the present invention will be described below with reference to the accompanying drawings.

FIRST EMBODIMENT

In the first embodiment, $ClF_3$ gas and $TiCl_4$ gas are used in etching a thin $(Ba,Sr)TiO_3$ (BST) film.

Figure 1:
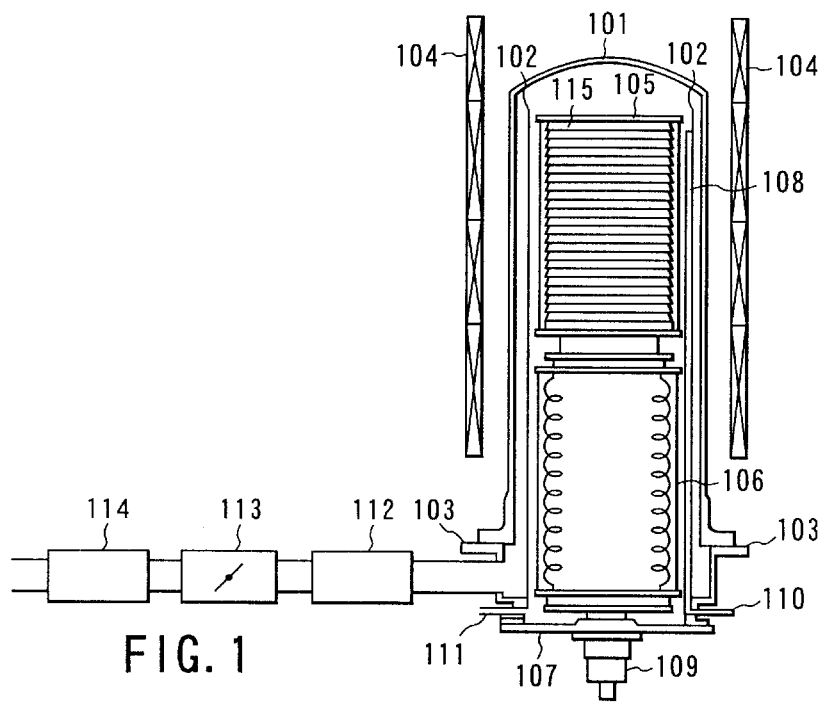
FIG. 1 is a view showing an outline of the arrangement of a chemical vapor growth apparatus according to the first embodiment of the present invention.

FIG. 1 is a view showing an outline of the arrangement of a hot wall batch type chemical vapor growth apparatus for forming a thin BST film. An inner tube 102 is installed in a quartz reaction chamber 101 placed on a reaction chamber base 103. This inner tube 102 contains a substrate boat 105 which is placed on a substrate boat base 107 and on which substrates 115 to be processed are placed. The substrate boat 105 can be rotated by a substrate boat rotating mechanism 109.

A resistance heater 104 is installed outside the reaction chamber 101. An organic metal gas for depositing a thin BST film is supplied from an organic metal inlet port 110 into the inner tube 102 of the reaction chamber 101 through an organic metal gas supply nozzle 108. Gases such as $O_2$ and Ar, other than organic metals, used when a thin BST film is deposited and $ClF_3$ and $TiCl_4$ as cleaning gases are supplied from a gas inlet port 111. A vacuum exhaust pump 114 is connected to the reaction chamber 101 via a trap 112 and a pressure adjusting valve 113.

Procedures of forming a thin BST film and cleaning using $ClF_3$ gas and $TiCl_4$ gas as halogen element-containing gases by using this apparatus will be described below.

First, substrates 115 are mounted on the substrate boat 105 and loaded into the reaction chamber 101. Each substrate 115 is composed of a silicon substrate, a 100-nm thick silicon oxide ($SiO_2$) film formed on the silicon substrate by thermal oxidation, and a 50-nm thick $SrRuO_3$ (SRO) film deposited on this silicon oxide film by CVD using $Sr(THD)_2$ and $Ru(THD)_3$ (THD=$C_{11}H_{19}O_2$). Note that THD is 2,2,6,6-tetramethyl-3,5-heptanedione ($C_{11}H_{19}O_2$).

Next, after the substrate boat 105 on which the substrates 115 are mounted is loaded into the reaction chamber 101, the pressure adjusting valve 113 is opened to allow the vacuum exhaust pump 114 to exhaust the reaction chamber 101. After that, the pressure adjusting valve 113 is used to adjust the internal pressure of the reaction chamber to 1 Torr, and the resistance heater 104 is operated to heat the substrates 115.

When the reaction chamber 101 is well exhausted and the temperature of the substrates 115 becomes 400° C., $Ba(THD)_2$, $Sr(THD)_2$, $Ti(i-OPr)_2(THD)_2$, and $O_2$ (i-OPr=i-$OC_3H_7$) as gases for depositing a thin BST film and Ar as a diluent gas are supplied into the reaction chamber 101 to start depositing a thin BST film. Note that i-OPr is isopropoxide ($OC_3H_7$). The flow rates of these source gases are so adjusted that the composition of a thin BST film to be deposited is $Ba_{0.5}SR_{0.5}TiO_3$.

By film deposition for 20 min, a 20-nm thick BST film is deposited on each substrate 115. The deposition of this thin BST film is completed by stopping the supply of the source gases into the reaction chamber 101. After the deposition is completed, the reaction chamber 101 is evacuated to exhaust the residual gases. After the residual gases are well exhausted, the internal pressure of the reaction chamber 101 is returned to normal pressure, and the substrates 115 are unloaded. After this thin BST film deposition, deposition of a film containing Ba, Sr, Ti, and O was found in the reaction chamber 101, the inner tube 102, the substrate boat 105, and the upper portion of a heat plug 106, and outside the nozzle 108.

Subsequently, the apparatus is cleaned as follows. First, the vacuum exhaust pump is used to exhaust the reaction chamber 101. The resistance heater 104 is then used to heat portions to be cleaned, i.e., the reaction chamber 101, the inner tube 102, the nozzle 108, and the substrate boat 105, to a temperature necessary for cleaning, e.g., 850° C.

Next, $ClF_3$ and $TiCl_4$ gases as cleaning gases of this embodiment and Ar as a diluent gas are supplied into the reaction chamber 101 from the gas inlet port 111. The flow rates of $ClF_3$, $TiCl_4$, and Ar are 2,000, 100, and 3,000 sccm, respectively. Also, the pressure adjusting valve 113 is used to adjust the internal pressure of the reaction chamber during cleaning to 1 Torr.

When the apparatus was cleaned for 5 min, the deposits sticking to the reaction chamber 101, the inner tube 102, the substrate boat 105, the heat plug 106, and the nozzle 108 were completely removed. After that, thin BST films were deposited on new substrates to be processed, and particle contamination after the deposition was checked using a particle counter. Consequently, no big difference was found between these substrates and the previous substrates, and almost no particle contamination was observed.

As described above, the present inventors have confirmed that when $ClF_3$ gas is used, cleaning after chemical vapor deposition of a thin BST film according to the present invention can be perfectly performed.

Gas cleaning of a CVD apparatus for forming a thin BST film can be perfectly performed by using $ClF_3$ gas and $TiCl_4$ gas as described above because even after Ti is completely etched and no Ti is present any longer in objects to be cleaned, the $TiCl_4$ gas keeps supplying Ti, so halides such as Ba—Ti and Sr—Ti necessary for etching form.

As a control, an experiment was conducted by exposing, to $ClF_3$ gas, a sample formed by depositing a 100-nm BST film on a quartz substrate by CVD. The thin BST film deposition conditions were the same as described above. The cleaning conditions were also the same as described above except no $TiCl_4$ gas was used.

Figure 2:
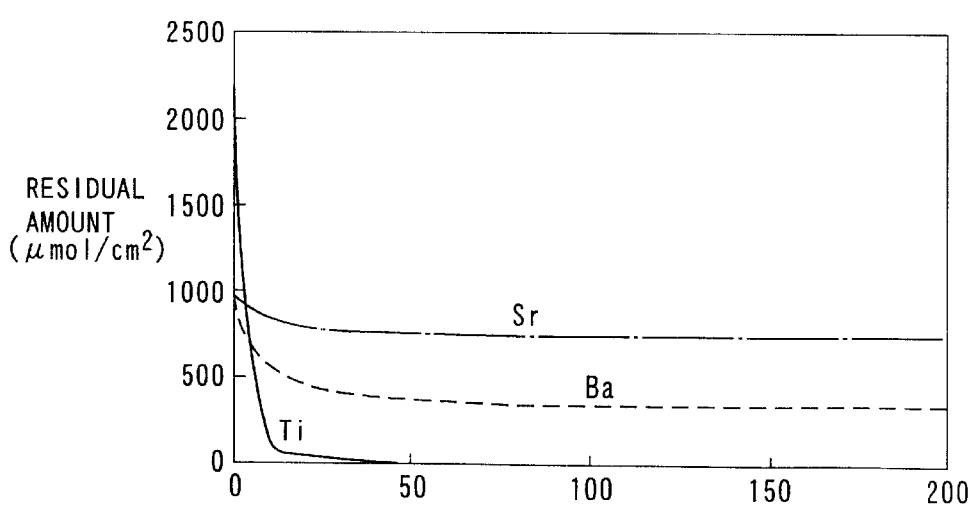
FIG. 2 is a graph showing the dependence of the etching amounts of Ba, Sr, and Ti on etching time when $ClF_3$ gas was used as an etching gas.

FIG. 2 shows the dependence of the etching amounts of Ba, Sr, and Ti on etching time in this experiment. As shown in FIG. 2, Ti was completely etched in about 20 sec. In contrast, although Ba and Sr were etched until 20 sec, the etching of these Ba and Sr showed almost no further progress even after the etching was continued for 3 min or more. That is, Ba and Sr were not completely etched.

From the foregoing, when $ClF_3$ gas alone is used Ba and Sr are etched simultaneously with Ti, and Ba and Sr cannot be etched any longer when no more Ti exists in an object to be etched. This implies that Ba and Sr are etched as halides Ba—Ti and Sr—Ti.

To confirm this, the present inventors conducted the following experiment. That is, a sample formed by depositing a 100-nm thick BST film on a quartz substrate by CVD was exposed to a cleaning gas mixture of $ClF_3$ gas and $TiCl_4$ gas. The thin BST film deposition conditions and the conditions in which the sample was exposed to the cleaning gas mixture of $ClF_3$ gas and $TiCl_4$ gas were the same as described above.

Figure 3:
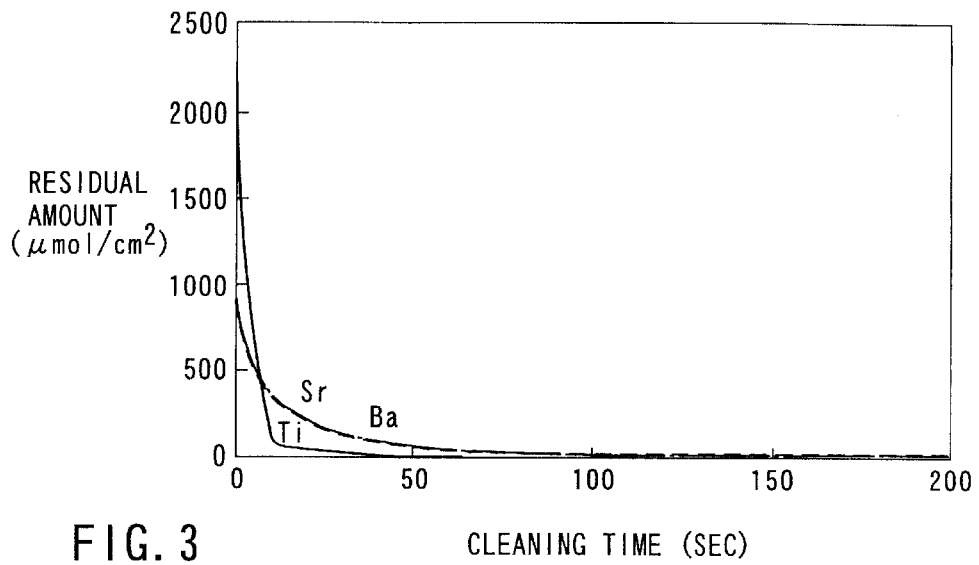
FIG. 3 is a graph showing the dependence of the etching amounts of Ba, Sr, and Ti on etching time when $ClF_3$ gas and $TiCl_4$ were used as etching gases.

FIG. 3 shows the etching time dependence of the etching amounts of Ba, Sr, and Ti in this experiment. As shown in FIG. 3, Ti was completely etched in about 20 sec. After Ti was thus completely etched, Ba and Sr were kept etched and, in about 1 min, completely etched. This is so because even after Ti was completely eliminated from the object to be etched, the $TiCl_4$ gas kept supplying Ti, so halides Ba—Ti and Sr—Ti necessary to etch Ba and Sr formed.

The present inventors have also confirmed that a similar effect is achieved by using Ti halides such as $TiI_4$ and $TiBr_4$, instead of $TiCl_4$ gas, and gas cleaning of the chemical vapor growth apparatus for depositing a thin BST film can be perfectly performed.

Furthermore, the present inventors have confirmed that the chemical vapor growth apparatus can be similarly cleaned by using a halogen-containing gas other than $ClF_3$.

Note that the present invention is also applicable to etching of a thin BST film formed on a sample, as well as to cleaning of a chemical vapor growth apparatus.

SECOND EMBODIMENT

In the second embodiment, dry etching of a thin BST film used in a capacitor of a DRAM will be explained.

FIG. 4 shows some of capacitor formation steps in the fabrication process of a DRAM having a capacitor using a thin BST film. A hole serving for a connection plug of a storage electrode is formed in an $SiO_2$-based interlayer dielectric film 401, and a barrier layer 402 is formed by sequentially depositing TiN and Ti by CVD. After that, the hole is filled with W (tungsten) by CVD. Excess W deposited on the interlayer insulating film 401 is removed by CMP. The resultant structure is planarized so that the upper end of the W is substantially flush with the surface of the interlayer insulating film 401, and a W plug 403 is buried in the hole. Subsequently, an SiN film 404 and an $SiO_2$-based interlayer dielectric film 405 are deposited by CVD. A hole for forming a capacitor is formed in the silicon nitride film 404 and the interlayer dielectric film 405 by using conventional lithography and dry etching.

Figure 4A:
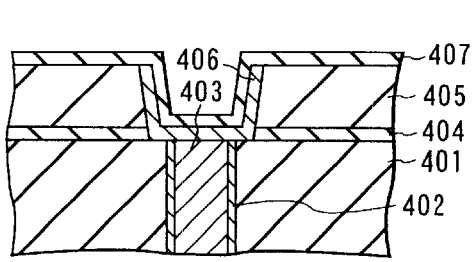
FIGS. 4A to 4D are sectional views showing some of capacitor formation steps, in order of steps, in the fabrication process of a DRAM according to the second embodiment of the present invention.

An $SrRuO_3$ (SRO) film 406 serving as a storage electrode is formed by CVD using $Sr(THD)_2$, $Ru(THD)_3$, and $O_2$ as materials. After this SRO film 406 is formed, the SRO film 406 deposited on top of the interlayer insulating film 405 is removed by CMP to leave the SRO film 406 in the opening. A thin BST film 407 serving as a capacitor dielectric film is formed by CVD using $Ba(THD)_2$, $Sr(THD)_2$, $Ti(i-OPr)_2$ $(THD)_2$, and $O_2$ and crystallized by heat processing. FIG. 4A is a sectional view of the element formed up to this step.

Figure 4B:
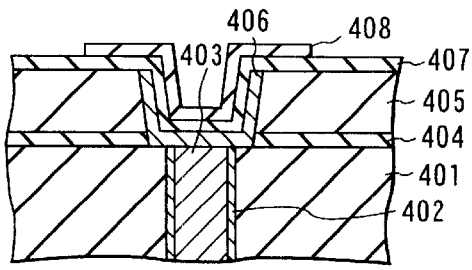

Next, an $SiO_2$ film serving as a mask when the thin BST film 407 is dry-etched is formed by CVD, and a mask pattern 408 is formed by conventional lithography and dry etching. FIG. 4B shows the element formed up to this step.

The thin BST film 407 is then dry-etched by using the mask pattern 408. This dry etching of the thin BST film 407 is done by using an etching apparatus shown in FIG. 5. This etching apparatus is a single wafer equipment in which a resistance heater 504 for heating a substrate 505 to be etched is installed together with a substrate holder 503 in a reaction chamber 501 via a base 502. A diluent gas can be supplied into the reaction chamber 501 via a mass-flow controller 509 and an on-off valve 511. The material of an etching gas is contained in a material container 507. In this apparatus the etching gas material is assumed to be a solid or liquid. When the material container 507 is raised to an appropriate temperature, a vapor (gas) of the material is produced. A mass-flow controller 508 controls the flow rate of this gas and supplies the gas into the reaction chamber 501 via an on-off valve 510. A shower head 506 straightens the etching gas and diluent gas supplied into the reaction chamber and evenly sprays these gases against the substrate 505. The reaction chamber is exhausted by a vacuum exhaust pump 513 and is so controlled by a pressure adjusting valve 512 that the internal pressure of the reaction chamber is constant. An exhaust gas processor 514 makes the exhaust gas harmless and releases the gas into the air.

In the second embodiment, iodine ($I_2$) is used as the etching gas material, and Ar as the diluent gas. $I_2$ gas is produced when the temperature of the container 507 containing $I_2$ is raised to 70° C. The flow rate of this $I_2$ gas is controlled to 50 sccm by the mass-flow controller 508. The flow rate of the diluent Ar gas is controlled to 50 sccm by the mass-flow controller 509. The internal pressure of the reaction chamber is 1 Torr. The resistance heater 504 raises the temperature of the substrate to be processed to 650° C. or more, preferably, 700° C. Under the conditions, the substrate to be processed shown in FIG. 4B is etched for 5 min.

Figure 4C:
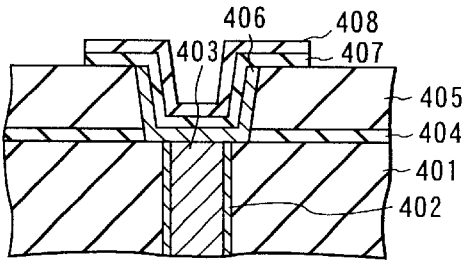

After this substrate was unloaded, a section of the substrate was observed. Consequently, the thin BST film 407 was patterned as shown in FIG. 4C. Also, the mask pattern 408 and interlayer insulating film 405 made from $SiO_2$ and exposed to the $I_2$ gas were not etched at all and were not reduced in film thickness. When portions from which the thin BST film 407 was removed were carefully examined, no residue of any kind was found.

Figure 4D:
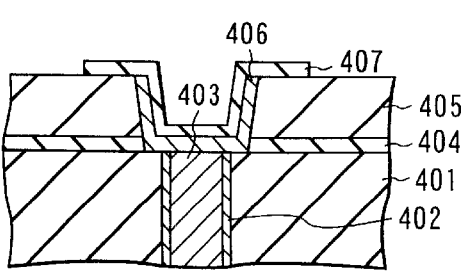

After that, the mask pattern 408 is removed. FIG. 4D is a sectional view of the element formed as above. A DRAM capacitor is completed by forming a plate electrode on top of the structure.

As described above, the present inventors have found that etching of a thin BST film which is conventionally difficult to perform can be performed by the use of $I_2$ gas. This is so because when a thin BST film is exposed to $I_2$ gas at a high temperature, iodides of Ba, Sr, and Ti as constituent elements of the thin BST film form, and these iodides have enough vapor pressures at which they volatize at a temperature of about 700° C. The present inventors have also confirmed that $SiO_2$ is not etched at all even when $I_2$ gas is heated to a high temperature.

An experiment was conducted by using the same apparatus under the same conditions except that bromine ($Br_2$) gas which is a liquid at room temperature was used in place of $I_2$ gas, with the result that a thin BST film was similarly etched. Note that $Br_2$ gas is produced by heating a material container filled with liquid $Br_2$ to 40° C.

THIRD EMBODIMENT

In the third embodiment, a thin BST film 407 on the substrate to be processed shown in FIG. 4B is etched following the same procedures as in the second embodiment by using, as etching gases, chlorine ($Cl_2$) as a halogen gas and hydrogen chloride (HCl), hydrogen bromide (HBr), or hydrogen iodide (HI) as a halogen hydride. Since $Cl_2$, HCl, HBr, and HI are gases at room temperature, the use of any of these gases as an etching gas makes supply of the etching gas easier than when a liquid or solid material is used as in the second or fourth embodiment.

Figure 5:
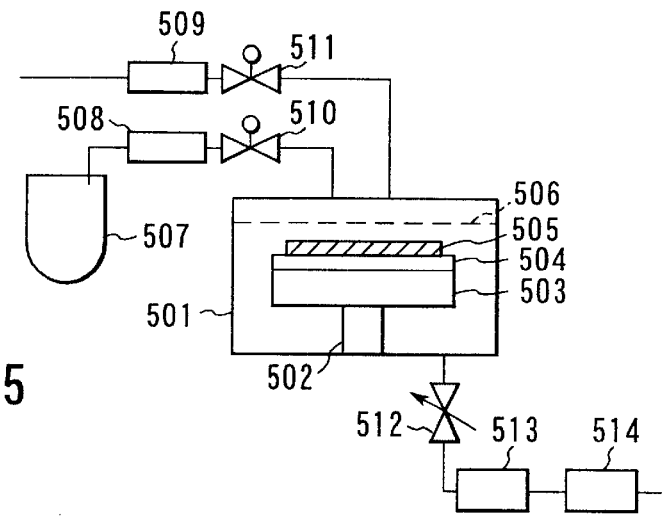
FIG. 5 is a view showing an outline of the arrangement of an etching apparatus according to the second embodiment.
Figure 6:
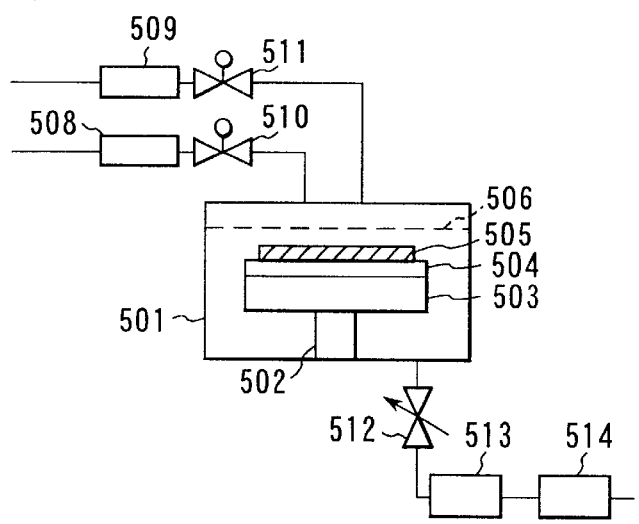
FIG. 6 is a view showing an outline of the arrangement of an etching apparatus according to the third embodiment of the present invention.

An etching apparatus shown in FIG. 6 is used in dry etching of a thin BST film using $Cl_2$ gas because $Cl_2$ is a gas at room temperature. The etching apparatus shown in FIG. 6 has exactly the same arrangement as the apparatus of FIG. 5 except for the absence of the material container 507. So, the same reference numerals as in FIG. 5 denote the same parts in FIG. 6. The arrangement of the etching apparatus is simple because an etchant is a gas. Note that Ar gas is used as a diluent gas.

To etch a thin BST film, a mass-flow controller 508 controls the flow rate of $Cl_2$ gas to 50 sccm. A mass-flow controller 509 controls the flow rate of Ar gas to 50 sccm. The internal pressure of a reaction chamber 501 is 1 Torr. A resistance heater 504 raises the temperature of the substrate to be processed to 800° C.

Under the conditions, the substrate to be processed shown in FIG. 4B is etched for 5 min. After the substrate was unloaded, a section of the substrate was observed. Consequently, the thin BST film was patterned as shown in FIG. 4C. Also, a mask pattern 408 and an interlayer dielectric film 405 primarily made from $SiO_2$ and exposed to the $Cl_2$ gas were not etched at all and were not reduced in film thickness. When portions from which the thin BST film 407 was removed were carefully examined, no residue of any kind was found.

Analogous experiments were conducted using HCl, HBr, and HI. In these experiments, the etching gas flow rate was 50 sccm, and the diluent Ar gas flow rate was 50 sccm. The etching temperature was 800° C. for HCL and 700° C. for HBr and HI. When any of HCl, HBr, and HI was used, the thin BST film 407 was completely etched, and no residue of any kind was found.

As described above, the present inventors have found that etching of a thin BST film which is conventionally difficult to perform can be performed when any of HCl, HBr, and HI gases is used. This is so because when a thin BST film is exposed to any of these etching gases at a high temperature, chlorides, bromides, or iodides of Ba, Sr, and Ti as constituent elements of the thin BST film form, and these chlorides, bromides, or iodides have enough vapor pressures at which they volatize at a temperature of about 700 to 800° C. The present inventors have also confirmed that $SiO_2$ is not etched at all even when $Cl_2$ gas or a hydride of Cl, Br, or I gas is used at high temperatures.

FOURTH EMBODIMENT

In the fourth embodiment, a thin BST film on the substrate to be processed shown in FIG. 4B is etched by using interhalogen compounds such as ICl, IBr, and BrCl as etching gases. The apparatus shown in FIG. 5 is used in etching a thin BST film because ICl, IBr, and BrCl are a solid, solid, and liquid, respectively, at room temperature.

First, ICl and Ar are used as an etching gas and a diluent gas, respectively, at a flow rate of 50 sccm. The internal pressure of a reaction chamber 501 is 1 Torr. A resistance heater 504 raises the temperature of the substrate to be processed to 600° C. Under the conditions, the substrate to be processed shown in FIG. 4B is etched for 5 min.

After the substrate was unloaded, a section of the substrate was observed. Consequently, a thin BST film 407 was patterned as shown in FIG. 4C. Also, a mask pattern 408 and an interlayer insulating film 405 primarily made from $SiO_2$ and exposed to the ICl gas were not etched at all and were not reduced in film thickness. When portions from which the thin BST film 407 was removed were carefully examined, no residue of any kind was found.

Similar experiments were conducted using IBr and BrCl. In these experiments, the etching gas flow rate was 50 sccm, the diluent Ar gas flow rate was 50 sccm, and the etching temperature was 600° C. for both of them.

When either IBr or BrCl was used, BST was completely etched, and no residue of any kind was found. As described above, the present inventors have found that etching of a thin BST film which is conventionally difficult to perform can be performed when IBr or BrCl is used. This is so because when a thin BST film is exposed to either of these etching gases at a high temperature, chlorides, bromides, or iodides of Ba, Sr, and Ti as constituent elements of the thin BST film form, and these chlorides, bromides, or iodides have enough vapor pressures at which they volatize at a temperature of about 600 to 700° C. The present inventors have also confirmed that $SiO_2$ is not etched at all even when ICl, IBr, or BrCl is used at high temperatures.

When an interhalogen compound such as ICl, IBr, or BrCl is used, the etching temperature can be decreased to about 600° C. which is lower than when a halogen or a hydride of a halogen is used as in the second or third embodiment. This is so because halogen radicals form when an interhalogen compound is heated to about 600° C.

FIFTH EMBODIMENT

In the fifth embodiment, a thin BST film on the substrate to be processed shown in FIG. 4B is dry-etched by using an etching gas ($I_2$) activated by a microwave plasma.

Figure 7:
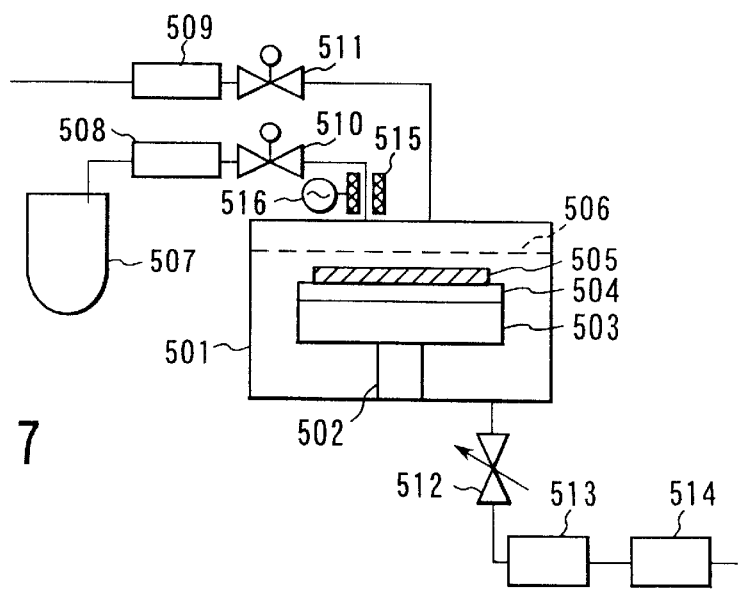
FIG. 7 is a view showing an outline of the arrangement of an etching apparatus according to the fifth embodiment of the present invention.

First, in FIG. 4B, a thin BST film 407 is dry-etched by using an $SiO_2$ mask pattern 408. An apparatus shown in FIG. 7 is used in this dry etching of the thin BST film 407. Note that the same reference numerals as in FIG. 5 denote the same parts in FIG. 7, and a detailed description thereof will be omitted. The characteristic feature of this apparatus is that a source gas is activated, immediately before being supplied into a reaction chamber 501, by a plasma which a microwave discharge tube 515 forms by discharge when applied with a microwave from a microwave power supply 516.

In the fifth embodiment, iodine ($I_2$) is used as an etching gas material, and Ar as a diluent gas. $I_2$ gas is produced when the temperature of a container 507 containing $I_2$ is raised to 70° C. A mass-flow controller 508 controls the flow rate of the $I_2$ gas to 50 sccm. The applied microwave has a frequency of 13.6 MHz and a power of 150 W. A mass-flow controller 509 controls the flow rate of the diluent Ar gas to 50 sccm. The internal pressure of the reaction chamber 501 is 1 Torr. A resistance heater 504 raises the temperature of the substrate to be processed to 600° C.

Under the conditions, the substrate to be processed shown in FIG. 4B is etched for 5 min. After the substrate was unloaded, a section of the substrate was observed. Consequently, a thin BST film was patterned as shown in FIG. 4C. Also, an $SiO_2$ film 408 and an interlayer dielectric film 405 exposed to the $I_2$ gas were not etched at all and were not reduced in film thickness. When portions from which the thin BST film 407 was removed were carefully examined, no residue of any kind was found.

As described above, the present inventors have found that etching of a thin BST film which is conventionally difficult to perform can be performed by using $I_2$ gas activated by a microwave plasma. Additionally, the etching can be performed at a lower temperature than when inactivated $I_2$ is used as described in the second embodiment. This is so because I radicals form when $I_2$ gas is activated, iodides of Ba, Sr, and Ti as constituent elements of a thin BST film form at a lower temperature, and these iodides have enough vapor pressures at which they volatize. The present inventors have also confirmed that $SiO_2$ is not etched at all even when the activated $I_2$ gas is heated to a high temperature.

Similar experiments were conducted using gases obtained by activating $Cl_2$, Br, HCl, HBr, and HI by a microwave plasma. Consequently, when any of these activated gases was used a thin BST film could be etched without etching $SiO_2$ at a lower temperature than when these gases were not activated by a microwave.

Comparative Example 1

A comparative example in which $ClF_3$ containing F is used as an etching gas for a thin BST film will be described below.

First, a substrate to be processed having a sectional structure as shown in FIG. 4B is formed following the procedure explained in the second embodiment. The apparatus shown in FIG. 6 is used in dry etching of a thin BST film using $ClF_3$. A mass-flow controller 608 controls the flow rate of $ClF_3$ to 50 sccm. A mass-flow controller 609 controls the flow rate of Ar gas as a diluent gas to 50 sccm. The internal pressure of a reaction chamber is 1 Torr. A resistance heater 604 raises the temperature of the substrate to be processed to 850° C. Under the conditions, the substrate to be processed shown in FIG. 4B is etched for 5 min.

After the substrate was unloaded, a section of the substrate was observed. Consequently, an $SiO_2$ mask pattern 408 completely disappeared, and pattern transfer was found in an interlayer dielectric film 405. Also, a thin BST film 407 was not completely removed in any portion. When the remaining thin BST film was examined, almost no Ti was detected but Ba and Sr remained.

As described above, the present inventors have found that when $ClF_3$ containing fluorine is used as an etching gas, Ba and Sr are not etched even if the etching temperature is raised to 850° C., so not only a thin BST film is not completely etched but also $SiO_2$ is damaged. This is because the etching gas contains F. F or activated F etches $SiO_2$ and forms thermodynamically stable fluorides of alkaline-earth metals such as $BaF_2$ and $SrF_2$. Fluorides of alkaline-earth metals remain as residues because they have almost no vapor pressure even at high temperatures.

FIGS. 8A and 8B show the dependence of etching rates on temperature when $ClF_3$ and $I_2$ are used, respectively. When $ClF_3$ is used, Ba and Sr are not etched unless the temperature is higher than 800° C. Also, the etching rate of quartz ($SiO_2$) is higher than those of Ba, Sr, and Ti. In contrast, when $I_2$ is used Ba and Sr are also etched at 600° C. or more and quartz ($SiO_2$) is hardly etched. This holds true not only when $I_2$ gas is used but also when the gases explained in the second to fifth embodiments are used. Especially when an interhalogen compound or a plasma-activated halogen gas is used, the etching temperature can be further lowered.

FIG. 9 shows the dependence of the vapor pressures of chlorides, bromides, and iodides of Ba and Sr on temperature. Also, FIG. 10 collectively shows the etching results of thin BST films and $SiO_2$ explained in the second to fifth embodiments and comparative example 1.

SIXTH EMBODIMENT

In the sixth embodiment, a cleaning method of the present invention is applied to a chemical vapor deposition (CVD) apparatus for forming a thin BST film.

Figure 11:
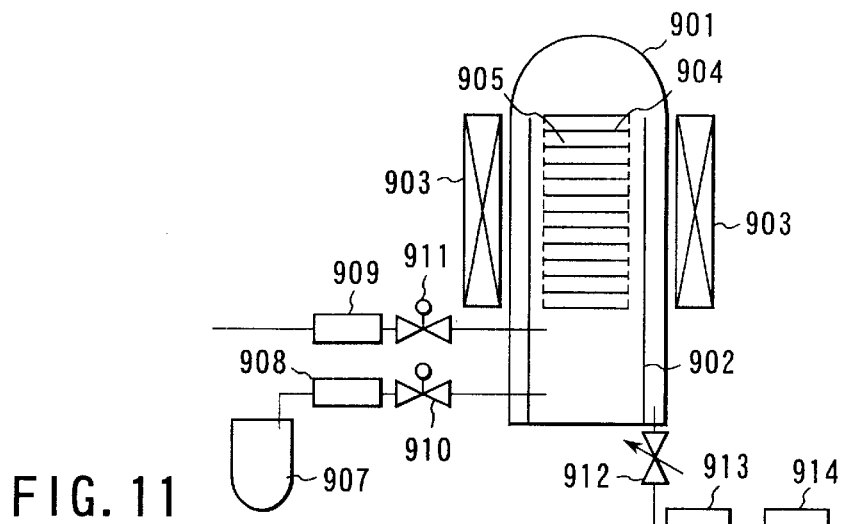
FIG. 11 is a view showing an outline of the arrangement of a hot wall batch type chemical vapor growth apparatus according to the sixth embodiment of the present invention.

FIG. 11 is a view showing an outline of the arrangement of a hot wall batch type chemical vapor growth apparatus used in the sixth embodiment. An inner tube 902 is installed in a quartz reaction chamber 901. This inner tube 902 contains a substrate boat 904 on which substrates 905 to be processed are placed. A resistance heater 903 is installed outside the reaction chamber 901. A material container 907 for supplying a cleaning gas is connected to the lower portion of the inner tube 902 via a mass-flow controller 908 and an on-off valve 910. This apparatus is assumed to use a liquid or solid substance as a material. A diluent gas is supplied from the lower portion of the reaction chamber 901 via a mass-flow controller 909 and an on-off valve 911. A gas supply system required to deposit a thin BST film is omitted from FIG. 11. A vacuum exhaust pump 913 is connected to the reaction chamber 901 via a pressure adjusting valve 912. The exhaust side of this vacuum exhaust pump 913 is connected to an exhaust gas processor 914 for exhausting a cleaning gas and a thin BST film deposition gas after making these gases harmless.

First, the substrates 905 are mounted on the substrate boat 904 and loaded into the reaction chamber 901. Each substrate 905 is composed of a silicon substrate, a 100-nm thick silicon oxide ($SiO_2$) film formed on the silicon substrate by thermal oxidation, and a 50-nm thick SRO film deposited on this silicon oxide film by CVD using $Sr(THD)_2$ and $Ru(THD)_3$.

Next, after the substrates 905 mounted on the substrate boat 904 is loaded, the pressure adjusting valve 912 is opened to allow the vacuum exhaust pump 913 to exhaust the reaction chamber 901. After that, the resistance heater 903 is operated to heat the substrates 905.

When the reaction chamber 901 is well exhausted and the temperature of the substrates 905 becomes 400° C., $Ba(THD)_2$, $Sr(THD)_2$, $Ti(i-OPr)_2(THD)_3$, and $O_2$ as gases for depositing a thin BST film and Ar as a diluent gas are supplied into the reaction chamber 901 to start depositing a thin BST film. The flow rates of these source gases are so adjusted that the composition of a thin BST film to be deposited is $Ba_{0.5}SR_{0.5}TiO_3$.

By film deposition for 30 min, a 20-nm thick BST film is deposited on each substrate 905. The deposition of this thin BST film is completed by stopping the supply of the source gases into the reaction chamber 901. After the deposition is completed, the reaction chamber 901 is evacuated to exhaust the residual gases. After the residual gases are well exhausted, the internal pressure of the reaction chamber is returned to normal pressure, and the substrates 905 are unloaded. After the thin BST film deposition, deposition of a film containing Ba, Sr, Ti, and O was found in the reaction chamber 901, the inner tube 902, and the substrate boat 904.

Next, cleaning of the apparatus will be described. First, the vacuum exhaust pump is used to exhaust the reaction chamber 901. The resistance heater 903 is then used to heat portions to be cleaned, i.e., the reaction chamber 901, the inner tube 902, and the substrate boat 904, to a temperature of 650° C. or more necessary for cleaning, e.g., 700° C.

$I_2$ as a cleaning gas of this embodiment is supplied into the reaction chamber 901 via the mass-flow controller 908 and the on-off valve 910. Simultaneously, Ar as a diluent gas is supplied via the on-off valve 911 while the flow rate is controlled by the mass-flow controller 909. Since $I_2$ is a solid at room temperature, $I_2$ is contained in the container 907, and this container 907 is heated to 100° C. to produce $I_2$ gas. The flow rates of the $I_2$ gas and the Ar diluent gas are 500 sccm. Also, the pressure adjusting valve 912 adjusts the internal pressure of the reaction chamber during cleaning to 1 Torr.

When the apparatus was cleaned for 5 min, the deposits sticking to the reaction chamber 901, the inner tube 902, and the substrate boat 904 were completely removed. Also, the quartz reaction chamber 901, the inner tube 902, and the substrate boat 904 were not damaged at all by the cleaning gas.

After that, thin BST films were deposited on new substrates, and particle contamination after the deposition was checked using a particle counter. Consequently, no big difference was found between these substrates and the previous substrates, and almost no particle contamination was observed.

As described above, the present inventors have found that when $I_2$ gas is used, cleaning after chemical vapor deposition of a thin BST film according to the present invention can be performed without damaging quartz.

The present inventors also conducted similar cleaning experiments by using halogen gases $Cl_2$ and $Br_2$ other than $I_2$, and HI, HBr, and HCl as hydrides of halogens. The apparatus shown in FIG. 11 was used for $Br_2$ which is a liquid at room temperature, and an apparatus shown in FIG. 12 was used for $Cl_2$, HCl, HBr, and HI which are gases at room temperature. Note that the same reference numerals as in FIG. 11 denote the same parts in FIG. 12, and a detailed description thereof will be omitted.

Figure 12:
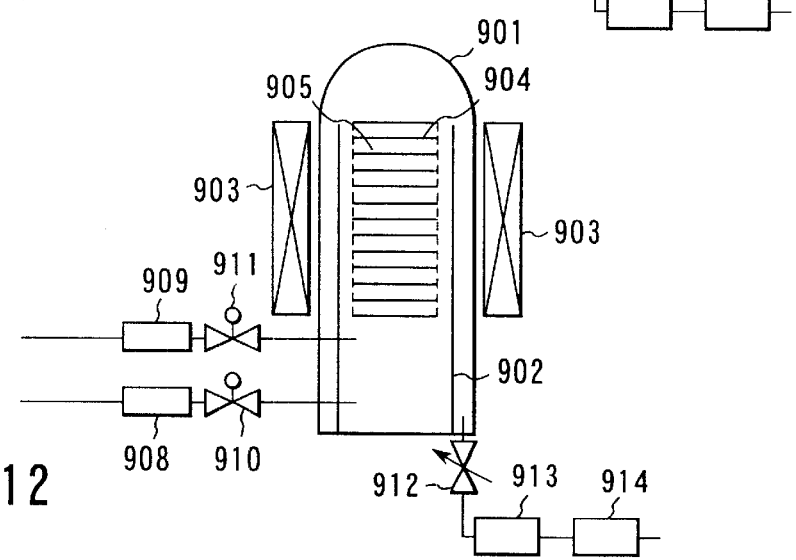
FIG. 12 is a view showing an outline of the arrangement of another hot wall batch type chemical vapor growth apparatus according to the sixth embodiment.

When substances which are gases at room temperature, such as $Cl_2$, HCl, HBr, and HI, are used as cleaning gases, the cleaning gas supply means can be simplified as in the apparatus shown in FIG. 12.

The results of the cleaning experiments showed that cleaning after thin BST film formation by CVD could be performed at 700° C. for $Br_2$, HI, and HBr and at 800° C. for $Cl_2$ and HCl. Also, when any gas was used, no quartz parts exposed to the cleaning gas were damaged during cleaning.

Note that the cleaning temperature for gases containing Cl is higher than that for gases containing Br or I because the vapor pressures of chlorides of alkaline-earth metals such as Ba and Sr are lower than those of bromides or iodides of the same metals.

SEVENTH EMBODIMENT

In the seventh embodiment, interhalogen compounds BrCl, ICl, and IBr not containing fluorine are used as cleaning gases of a chemical vapor deposition (CVD) apparatus for forming a thin BST film. At room temperature BrCl is a liquid and ICl and IBr are solids, so the apparatus shown in FIG. 11 is used.

First, 20-nm BST films are deposited on substrates 905 following the same procedure as in the sixth embodiment, and the substrates are unloaded. After this thin BST film deposition, deposition of a film containing Ba, Sr, Ti, and O was found in a reaction chamber 901, an inner tube 902, and a substrate boat 904.

Next, the apparatus is cleaned. The cleaning procedure is the same as in the sixth embodiment except for the cleaning gases. The temperature of the chamber 901 is 70° C. for BrCl, 70° C. for ICl, and 80° C. for IBr. The flow rates of these cleaning gases are 500 sccm, and the flow rate of a diluent Ar gas is also 500 sccm. The cleaning gas temperature is 600° C. for all cleaning gases.

When the apparatus was cleaned for 5 min, the deposits sticking to the reaction chamber 901, the inner tube 902, and the substrate boat 904 were completely removed. Also, no damages caused by the cleaning gases were found in the quartz reaction chamber 901, the inner tube 902, and the substrate boat 904.

After that, thin BST films were deposited on new substrates to be processed, and particle contamination after the deposition was checked using a particle counter. Consequently, no big difference was found between these substrates and the previous substrates, and almost no particle contamination was observed.

As described above, the present inventors have confirmed that when BrCl, ICl, and IBr gases are used, cleaning after chemical vapor deposition of thin BST films according to the present invention can be performed without damaging quartz at lower temperatures than when halogens are singly used. Cleaning can be performed at a low temperature of about 600° C. because active halogen radicals form when interhalogen compounds are heated to about 600° C.

EIGHTH EMBODIMENT

In the eighth embodiment, $Cl_2$, $Br_2$, and $I_2$ excited by a microwave plasma are used as cleaning gases of a chemical vapor deposition (CVD) apparatus for forming a thin BST film.

Figure 13:
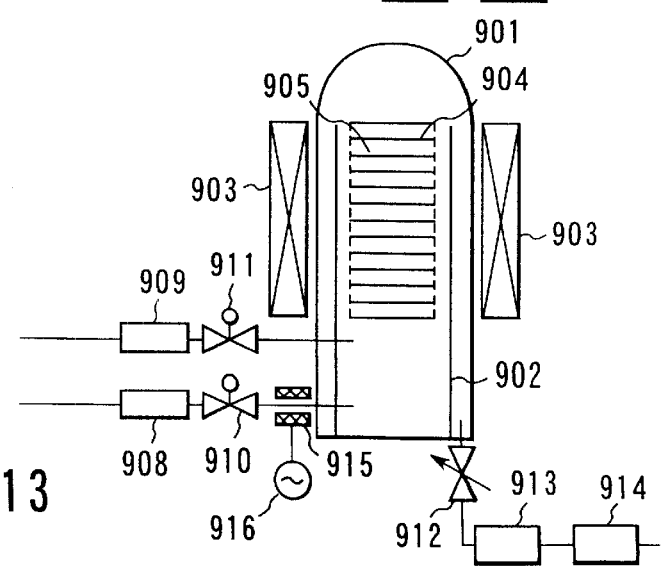
FIG. 13 is a view showing an outline of the arrangement of a hot wall batch type chemical vapor growth apparatus according to the eighth embodiment.

FIG. 13 is a schematic view of a CVD apparatus for forming a thin BST film used in the eighth embodiment. This apparatus is basically the same as the apparatus shown in FIG. 12 except that a cleaning gas is plasma-excited, immediately before being supplied into a reaction chamber 901, by a microwave discharge tube 915 applied with a microwave from a microwave power supply 916.

First, following the same procedure as in the sixth embodiment, 20-nm thick BST films are deposited on substrates 905 to be processed, and the substrates are unloaded. After this thin BST film deposition, deposition of a film containing Ba, Sr, Ti, and O was found in the reaction chamber 901, an inner tube 902, and a substrate boat 904.

Next, the apparatus is cleaned. The cleaning procedure is the same as in the sixth embodiment except for the cleaning gas. As the cleaning gas, $Cl_2$, $Br_2$, or $I_2$ gas is used. The flow rate of any of these cleaning gases is 500 sccm, and the flow rate of a diluent Ar gas is also 500 sccm. Each cleaning gas is plasma-excited by the discharge tube 915 applied with a microwave of 13.6 MHz and 100 W from the power supply 916. The cleaning gas temperature is 700° C. for $Cl_2$ and 600° C. for $Br_2$ and $I_2$.

When the apparatus was cleaned for 5 min, the deposits sticking to the reaction chamber 901, the inner tube 902, and the substrate boat 904 were completely removed. Also, no damages caused by the cleaning gas were found in the quartz reaction chamber 901, the inner tube 902, and the substrate boat 904. After that, thin BST films were deposited on new substrates to be processed, and particle contamination after the deposition was checked using a particle counter. Consequently, no big difference was found between these substrates and the previous substrates, and almost no particle contamination was observed.

As described above, the present inventors have found that when plasma-excited $Cl_2$, $Br_2$, and $I_2$ gases are used, cleaning after chemical vapor deposition of thin BST films according to the present invention can be performed without damaging quartz at lower temperatures than when halogens are singly used. Cleaning can be performed at low temperatures because active halogen radicals form by plasma excitation.

Comparative Example 2

A comparative example using $ClF_3$ containing F as a cleaning gas will be described below. The same apparatus as shown in FIG. 12 is used.

First, following the same procedure as in the sixth embodiment, 20-nm thick BST films are deposited on substrates 905 to be processed, and the substrates are unloaded. After this thin BST film deposition, deposition of a film containing Ba, Sr, Ti, and O was found in a reaction chamber 901, an inner tube 902, and a substrate boat 904.

Next, the apparatus is cleaned. The cleaning procedure is the same as in the sixth embodiment except for the cleaning gas. As the cleaning gas, $ClF_3$ is used. The flow rate of the cleaning gas is 500 sccm, and the flow rate of a diluent Ar gas is also 500 sccm. The cleaning temperature is 850° C. Even after the apparatus was cleaned for 10 min, the deposits sticking to the reaction chamber 901, the inner tube 902, and the substrate boat 904 were not completely removed. The unremoved deposits were examined and found to contain Ba, Sr, F, and O. When a halogen compound containing F is used as described above, fluorides of alkaline-earth metals form and remain unremoved because their vapor pressures are very low. Also, when cleaning using $ClF_3$ was repeated several times, devitrification was found in the quartz reaction chamber 901, the inner tube 902, and the substrate boat 904, indicating that $SiO_2$ was damaged.

NINTH EMBODIMENT

In the ninth embodiment, before a hot wall batch type chemical vapor growth apparatus is cleaned with gas, all quartz portions to be exposed to a cleaning gas at a high temperature are coated with a 0.2-$\mu$m thick $CaF_2$ film by plasma spray coating. The apparatus used in this ninth embodiment is the hot wall batch type chemical vapor growth apparatus shown in FIG. 1. The portions coated with $CaF_2$ are a reaction chamber 101, an inner tube 102, a substrate boat 105, a heat plug 106, and an organic metal gas supply nozzle 108.

Procedures of forming a thin BST film and performing cleaning using a gas mixture of $ClF_3$ gas and $TiCl_4$ gas by using this apparatus will be described below. First, following the same procedure as explained in the first embodiment, thin BST films are formed on substrates 115. By film deposition for 20 min, a 20-nm thick BST film is deposited on each substrate 115. The deposition of this thin BST film is completed by stopping the supply of the source gases into the reaction chamber 101. After the deposition is completed, the reaction chamber 101 is evacuated to exhaust the residual gases. After the residual gases are well exhausted, the internal pressure of the reaction chamber is returned to normal pressure, and the substrates 115 are unloaded. After this thin BST film deposition, deposition of a film containing Ba, Sr, Ti, and O was found in the reaction chamber 101, the inner tube 102, the substrate boat 105, and the upper portion of the heat plug 106, and outside the nozzle 108.

Subsequently, the apparatus is cleaned as follows. First, a vacuum exhaust pump is used to exhaust the reaction chamber 101. A resistance heater 104 is then used to heat portions to be cleaned, i.e., the reaction chamber 101, the inner tube 102, the nozzle 108, and the substrate boat 105, to a temperature necessary for cleaning, e.g., 850° C.

Next, $ClF_3$ and $TiCl_4$ gases as cleaning gases of this embodiment and Ar as a diluent gas are supplied into the reaction chamber 101 from a gas inlet port 111. The flow rates of $ClF_3$, $TiCl_4$, and Ar are 2,000, 10, and 3,000 sccm, respectively. Also, a pressure adjusting valve 113 is used to adjust the internal pressure of the reaction chamber during cleaning to 1 Torr.

When the apparatus was cleaned for 5 min, the deposits sticking to the reaction chamber 101, the inner tube 102, the substrate boat 105, the heat plug 106, and the nozzle 108 were completely removed. Also, no damages caused by the cleaning gases were found in any of the quartz reaction chamber 101, the inner tube 102, the substrate boat 105, the heat plug 106, and the nozzle 108. After that, thin BST films were deposited on new substrates to be processed, and particle contamination after the deposition was checked using a particle counter. Consequently, no big difference was found between these substrates and the previous substrates, and almost no particle contamination was observed.

As described above, the present inventors have confirmed that when $ClF_3$ gas is used, cleaning after chemical vapor deposition of thin BST films according to the present invention can be performed without damaging quartz. No damages were found in the quartz members even when these quartz members were exposed to the $ClF_3$ gas ambient at a high temperature of 850° C. because the surfaces of the quartz members exposed to the $ClF_3$ gas were coated with $CaF_2$. That is, although quartz is corroded by $ClF_3$ at high temperatures, $CaF_2$ is not corroded by $ClF_3$ but functions as a protective film even at high temperatures.

Changes in the surface state when a $CaF_2$ film was exposed to $ClF_3$ gas at high temperatures was checked by taking SEM photographs. That is, the surfaces of films not treated in $ClF_3$ gas at high temperatures, heat-treated in a $ClF_3$ gas ambient at 800° C., 820° C., and 860° C., and heat-treated in an Ar gas ambient at 860° C. were observed on SEM photographs. Cracks were found on the surfaces of films heat-treated in the $ClF_3$ gas ambient. However, cracks were also found on the samples heat-treated in the Ar gas ambient. Therefore, these cracks were formed probably not because heat treatment was performed in the $ClF_3$ gas ambient but because the thickness of the $CaF_2$ film was as large as 100 μm.

Figures 14, 15:
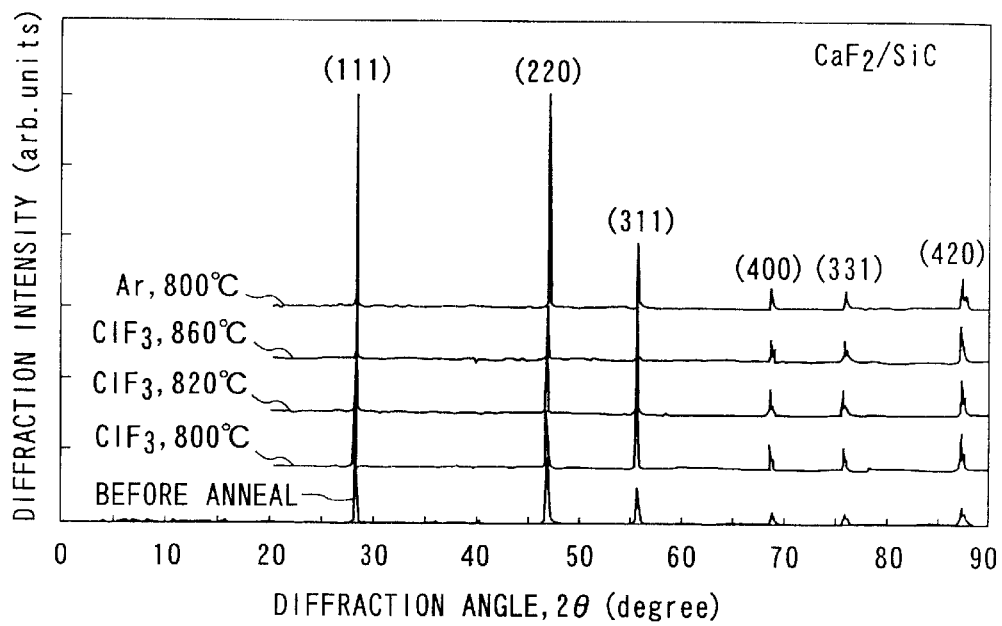
FIG. 14 is a graph showing diffraction patterns of $CaF_2$ exposed to etching processes at various temperatures.
FIG. 15 is a diagram showing the Ca and F contents and the composition ratio of $CaF_2$ exposed to etching processes at various temperatures.

FIG. 14 shows the X-ray diffraction patterns of these samples. As shown in FIG. 14, even when heat treatment was performed in the $ClF_3$ gas ambient, the same spectra before the heat treatment were observed. This demonstrates that the crystalline structure of $CaF_2$ was not destroyed.

FIG. 15 shows the results of ICP (Inductively Coupled Plasma) composition analysis of these samples. As shown in FIG. 15, no significant changes in the weights of constituent elements were caused by heat treatment in the $ClF_3$ gas ambient.

The experiments using quartz substrates coated with a fluoride of an alkaline-earth metal as described above shows that an alkaline-earth metal fluoride has resistance against $ClF_3$ at a high temperature of 800° C. or more and hence is effective as a quartz protecting film when cleaning using $ClF_3$ gas is performed.

For comparison, similar experiments were conducted by using a reaction chamber 101, an inner tube 102, a substrate boat 105, a heat plug 106, and an organic metal gas supply nozzle 108 not coated with $CaF_2$. Consequently, deposits on the reaction chamber 101, the inner tube 102, the substrate boat 105, the heat plug 106, and the organic metal supply nozzle 108 were removed by cleaning using $ClF_3$ gas. However, noticeable damages were found on the reaction chamber 101, the inner tube 102, the substrate boat 105, the heat plug 106, and the organic metal gas supply nozzle 108. These damages were particularly conspicuous in portions heated to a high temperature, i.e., the reaction chamber 101, the inner tube 102, the substrate boat 105, the upper portion of the heat plug 106, and the upper portion of the organic metal gas supply nozzle 108. Almost no damages were found in non-heated portions whose temperatures were not high, i.e., the lower portion of the heat plug 106 and the lower portion of the organic metal gas supply nozzle 108.

The present inventors also conducted similar experiments by using a reaction chamber 101, an inner tube 102, a substrate boat 105, a heat plug 106, and an organic metal gas supply nozzle 108 coated with $SrF_2$ or $BaF_2$ instead of $CaF_2$. Consequently, the deposits were completely removed by cleaning using $ClF_3$ gas, as when $CaF_2$ gas was used, and no damages of any kind were found in the quartz reaction chamber 101, the inner tube 102, the substrate boat 105, the heat plug 106, and the organic metal gas supply nozzle 108. This is so because $SrF_2$ or $BaF_2$ also has resistance, like $CaF_2$, against $ClF_3$. The reason for this is that fluorides of alkaline-earth metals such as $CaF_2$, $SrF_2$, and $BaF_2$ are thermodynamically very stable compounds.

To confirm this, the present inventors conducted the following experiment. A sample formed by depositing by CVD a 100-nm thick BST film on a quartz substrate coated with a $CaF_2$ film was exposed to $ClF_3$ gas. The deposition conditions of the thin BST film and the conditions in which the sample was exposed to the $ClF_3$ gas were the same as the aforementioned conditions. Also, a sample formed by depositing a thin BST film directly on a quartz substrate not coated with a $CaF_2$ film was used as a comparative example.

Figure 16A:
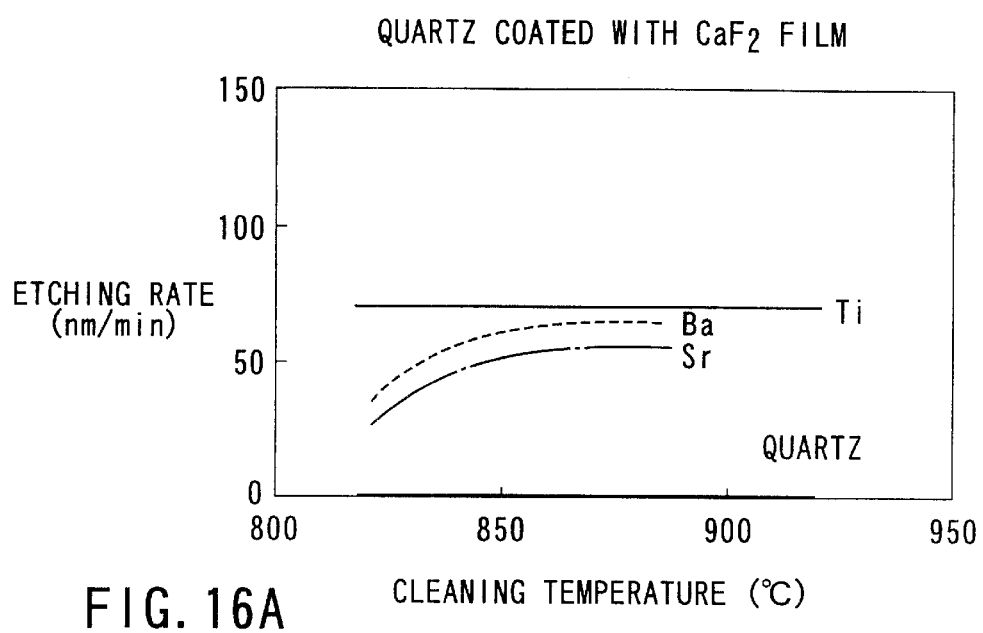
FIGS. 16A and 16B are graphs showing the etching rates of Ba, Sr, and Ti of a thin $(Ba,Sr)TiO_3$ film formed on a quartz substrate and $SiO_2$ when the film was and was not coated with a $CaF_2$ film.
Figure 16B:
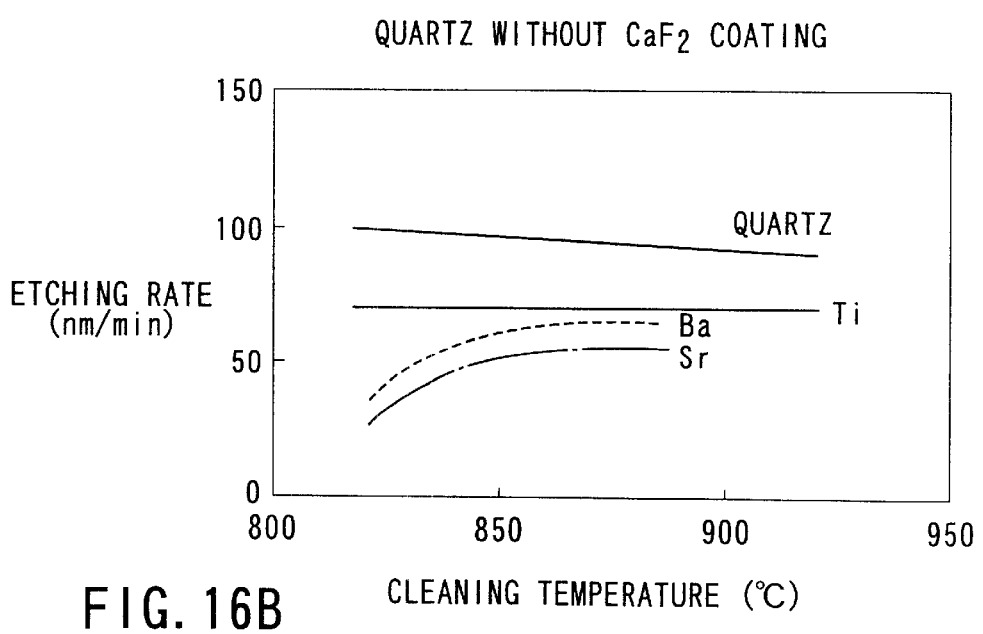

FIGS. 16A and 16B show the etching rates of Ba, Sr, Ti, and $SiO_2$ (quartz). The etching rates of Ba, Sr, and Ti and their dependence on temperature did not change regardless of whether the $CaF_2$ coating was present or absent. However, the etching rate of quartz largely changed in accordance with the presence/absence of the $CaF_2$ coating. That is, without any $CaF_2$ coating quartz was etched at a higher etching rate than those of Ba, Sr, and Ti. With the $CaF_2$ coating, however, quartz was hardly etched. This indicates that $CaF_2$ functioned as a film for protecting quartz from $ClF_3$. Furthermore, an experiment of exposing $CaF_2$-coated quartz to $ClF_3$ gas revealed that the crystalline structure, composition, and Ca and F contents of $CaF_2$ were the same before and after exposure to the $CaF_3$ gas. This implies that $CaF_2$ has resistance against $ClF_3$. Additionally, this resistance of $CaF_2$ against $ClF_3$ did not deteriorate even when the temperature of exposure to $ClF_3$ was raised to 900°

C. This does not mean 900° C. is the critical temperature of the resistance; this means that no further experiments have been conducted although the resistance probably exists even at temperatures higher than 900° C. The present inventors have also experimentally confirmed that the same effects as when the $CaF_2$ coating film described above was used are obtained when $SrF_2$ and $BaF_2$ are used as coating films.

Note that coating the surface of quartz with $CaF_2$ suppresses damages to the quartz. Therefore, Sr and Ba can be etched by using a gas not containing $TiCl_4$ (e.g., a fluorine-containing halogen gas or an interhalogen compound gas) by which the cleaning temperature can be further raised compared to normal temperatures.

10TH EMBODIMENT

In the 10th embodiment, a method using ordinary quartz members, rather than quartz members coated with fluorides of alkaline-earth metals as explained in the ninth embodiment, will be described. That is, in this 10th embodiment a fluoride of an alkaline-earth metal is deposited by CVD before deposition of BST, thereby depositing this alkaline-earth metal fluoride as a coating film on quartz members.

The 10th embodiment uses the same apparatus as in FIG. 1. However, each quartz member is not coated with $CaF_2$. Note that a gas for depositing a $CaF_2$ film is supplied from a port 111.

Procedures of depositing a $CaF_2$ protective film, forming a thin BST film, and performing cleaning using $ClF_3$ gas by using this apparatus will be described below. First, a substrate boat 105 not mounting substrates 115 on it is loaded into a reaction chamber 101. After the substrate boat 105 is loaded, a pressure adjusting valve 113 is opened to allow a vacuum exhaust pump 114 to exhaust the reaction chamber 101.

After that, the pressure adjusting valve 113 adjusts the internal pressure of the reaction chamber 101 to 1 Torr. A resistance heater 104 is operated to heat portions where a $CaF_2$ protective film is to be deposited. When the reaction chamber 101 is well exhausted and the temperature of the portions for deposition becomes 500° C., $Ca(HFA)_2$ (HFA= $C_5HF_6O_2$ hexafluoroacetxlaceton) as a $CaF_2$ protective film depositing gas and Ar as a diluent gas are supplied into the reaction chamber to start depositing a $CaF_2$ film.

By performing this film deposition for 30 min, a 100-nm thick $CaF_2$ film is formed on the portions for deposition, e.g., the reaction chamber 101, an inner tube 102, the substrate boat 105, the upper portion of a heat plug 106, and the interior of a nozzle 108. The deposition of this thin $CaF_2$ film is completed by stopping the supply of the source gases into the reaction chamber 101.

After the deposition is completed, the reaction chamber 101 is evacuated to exhaust the residual gases. After the residual gases are well exhausted, the internal pressure of the reaction chamber is returned to normal pressure. After this thin $CaF_2$ film deposition, deposition of the $CaF_2$ film was found in the reaction chamber 101, the inner tube 102, the substrate boat 105, the upper portion of the heat plug 106, and the interior of the nozzle 108.

Next, a process of depositing a thin BST film on a substrate is performed. The substrate boat 105 mounting the substrates 115 on it is loaded into the reaction chamber 101. Each substrate 115 is composed of a silicon substrate, a 100-nm thick silicon oxide ($SiO_2$) film formed on this silicon substrate by thermal oxidation, and a 50-nm thick $SrRuO_3$ (SRO) film deposited on this silicon oxide film by CVD using $Sr(THD)_2$ and $Ru(THD)_3$ (THD=$C_{11}H_{19}O_2$).

Thin BST films were formed for 20 min following the same procedure as in the first embodiment, and the substrates 115 are unloaded. After this BST film deposition, deposition of a film containing Ba, Sr, Ti, and O was found in the reaction chamber 101, the inner tube 102, the substrate boat 105, and the upper portion of the heat plug 106, and outside the nozzle 108.

Subsequently, the apparatus is cleaned as follows. First, a vacuum exhaust pump is used to exhaust the reaction chamber 101. The resistance heater 104 is then used to heat portions to be cleaned, i.e., the reaction chamber 101, the inner tube 102, the nozzle 108, and the substrate boat 105, to a temperature necessary for cleaning, e.g., 850° C.

Next, $ClF_3$ and $TiCl_4$ gases as cleaning gases of this embodiment and Ar as a diluent gas are supplied into the reaction chamber 101 from the gas inlet port 111. The flow rates of $ClF_3$, $TiCl_4$, and Ar are 2,000, 100, and 3,000 sccm, respectively. Also, the pressure adjusting valve 113 is used to adjust the internal pressure of the reaction chamber during cleaning to 1 Torr.

When the apparatus was cleaned for 5 min, the deposits sticking to the reaction chamber 101, the inner tube 102, the substrate boat 105, the heat plug 106, and the nozzle 108 were completely removed. Also, no damages of any kind caused by the cleaning gases were found in any of the quartz reaction chamber 101, the inner tube 102, the substrate boat 105, the heat plug 106, and the nozzle 108. After that, thin BST films were deposited on new substrates to be processed, and particle contamination after the deposition was checked using a particle counter. Consequently, no big difference was found between these substrates and the previous substrates, and almost no particle contamination was observed.

As described above, the present inventors have confirmed that when $ClF_3$ gas is used, cleaning after chemical vapor deposition of thin BST films according to the present invention can be performed without damaging quartz.

No damages were found in the quartz members even when these quartz members were exposed to the $ClF_3$ gas ambient at a high temperature of 850° C. because the surfaces of the quartz members exposed to the $ClF_3$ gas were coated with $CaF_2$. That is, although quartz is corroded by $ClF_3$ at high temperatures, $CaF_2$ is not corroded by $ClF_3$ but functions as a protective film even at high temperatures.

As described above, a $CaF_2$ film formed in the same manner as conventional CVD by using gases also has $ClF_3$ resistance at high temperatures and is effective as a quartz protecting film in $ClF_3$ cleaning.

The present inventors have also confirmed that when $SrF_2$ and $BaF_2$ are used as protective films, it is possible, as when $CaF_2$ is used, to protect quartz when cleaning using $ClF_3$ gas is performed. These $SrF_2$ film and $BaF_2$ film are deposited by using $Sr(HFA)_2$ and $Ba(HFA)_2$, respectively. The present inventors have further confirmed that quartz members are not damaged even when deposition of thin BST films is repeated a plurality of times with respect to one-time deposition of an alkaline-earth metal fluoride protective film.

As described above, the method of forming a protective film by using gases has the advantages that it is unnecessary to disassemble the apparatus in forming a protective film since the protective film is formed using gases as in normal CVD, and that even if a protective film deteriorates when BST film formation and $ClF_3$ cleaning are performed a large number of times, the protective film can be formed without immediately disassembling the apparatus. This increases the availability and throughput of the apparatus.

The above ninth and 10th embodiments are explained by taking a BST film formation apparatus and its cleaning method as examples. However, the present invention is not limited to these embodiments and applicable to other cases without departing from the gist of the invention. For example, a highly corrosive gas such as $ClF_3$ must be used at high temperatures in gas cleaning of a CVD apparatus for depositing a thin film containing, as a constituent element, an alkaline-earth metal, e.g., a ferroelectric substance such as $SrBi_2Ta_2O_9$ or an electrode material such as $SrRuO_3$. As a consequence, quartz members are damaged. The present invention can be applied to a CVD apparatus using such materials.

11TH EMBODIMENT

In the 11th to 15th embodiments, etching using a halogen gas, particularly chlorine gas will be described again.

In the 11th embodiment, dry etching of a thin BST film using chlorine gas is performed in two stages. This embodiment is an example of thin BST film etching in a peripheral circuit portion of a semiconductor memory device in which a thin BST film is formed as a capacitor dielectric film.

Figure 17:
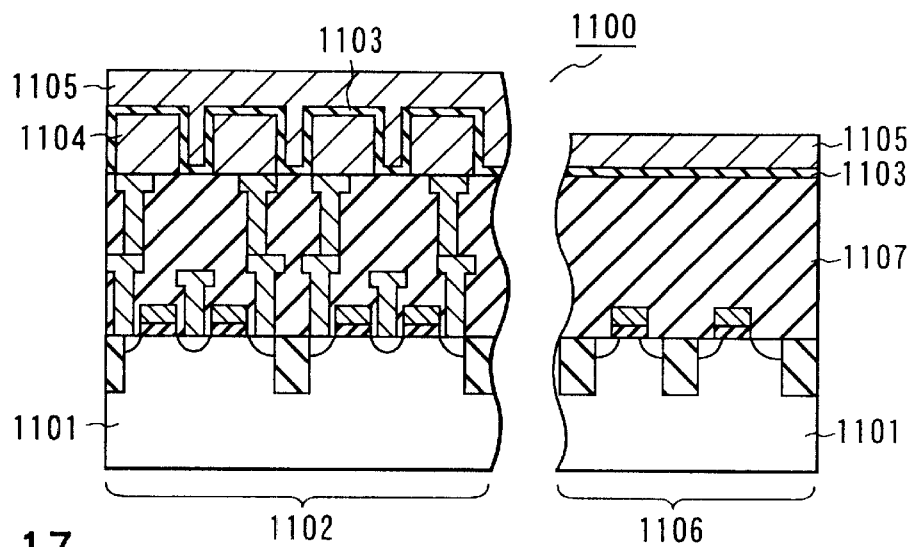
FIG. 17 is a sectional view showing a semiconductor storage device according to the 11th embodiment of the present invention.

FIG. 17 is a sectional view of a semiconductor memory device 1100 which is to undergo BST etching. In a DRAM cell portion 1102, a 20-nm thick BST film 1103 forms a capacitor between ruthenium films 1104 and 1105 as upper and lower electrodes. In a peripheral circuit portion 1106, this thin BST film 1103 is formed on a silicon oxide film 1107 of an interlayer dielectric film. The surface of this thin BST film 1103 is coated with the ruthenium film 1105 as an electrode.

Figure 18A:
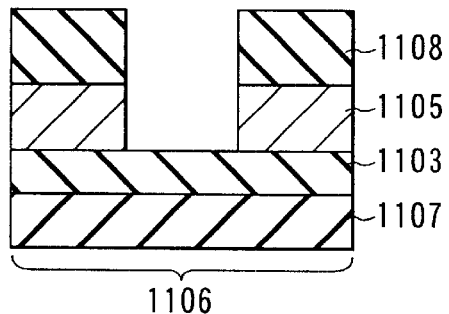
FIGS. 18A to 18C are sectional views of a peripheral circuit portion in FIG. 17, for explaining an etching method of the 11th embodiment.
Figure 18B:
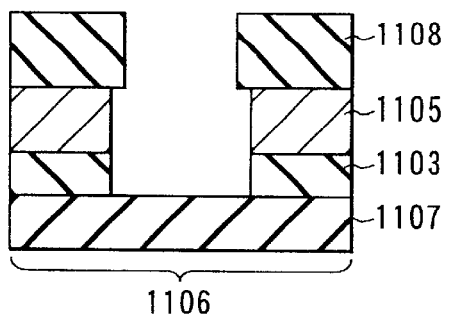
Figure 18C:
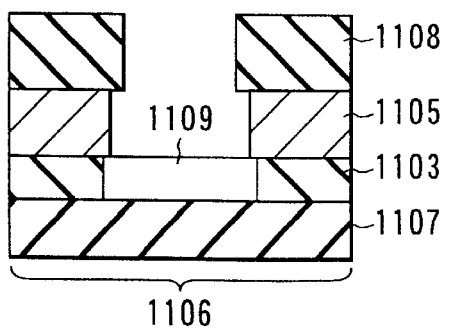

To form interconnections and the like in the peripheral circuit portion, it is necessary to remove the thin BST film 1103 and the ruthenium film 1105 from the peripheral circuit portion 1106. The process will be described below with reference to FIGS. 18A to 18C. FIGS. 18A to 18C are views showing only the peripheral circuit portion 1106 in enlarged scale for the sake of easy understanding.

First, a 300-nm thick silicon oxide film 1108 is formed as a hard mask on the ruthenium film 1105 by plasma CVD. This silicon oxide film 1108 and the ruthenium film 1105 are patterned by conventional lithography and dry etching (FIG. 18A).

The thin BST film is dry-etched as follows. That is, a substrate 101 to be processed is supported by a transparent quartz suscepter and heated by a heater using a halogen lamp. Nitrogen gas as a diluent gas and chlorine gas as an etching gas are supplied at a flow rate of 50 sccm. The etching pressure is 1 Torr. Under such etching gas supply conditions, the thin BST film is etched under the following different etching temperature conditions. Note that the rate of heating is 100° C./sec, and the rate of cooling, which is natural cooling, is about 20° C./sec.

The following six conditions were chosen as the etching temperature conditions:

(1) After etching at 500° C. for 2 min, etching at 820° C. for 2 min.
(2) After etching at 820° C. for 2 min, etching at 500° C. for 2 min.
(3) Only etching at 500° C. for 2 min as a reference.
(4) Only etching at 820° C. for 2 min as a reference.
(5) Only etching at 500° C. for 2 hr as a reference.
(6) Only etching at 820° C. for 2 hr as a reference.

Figures 19, 20:
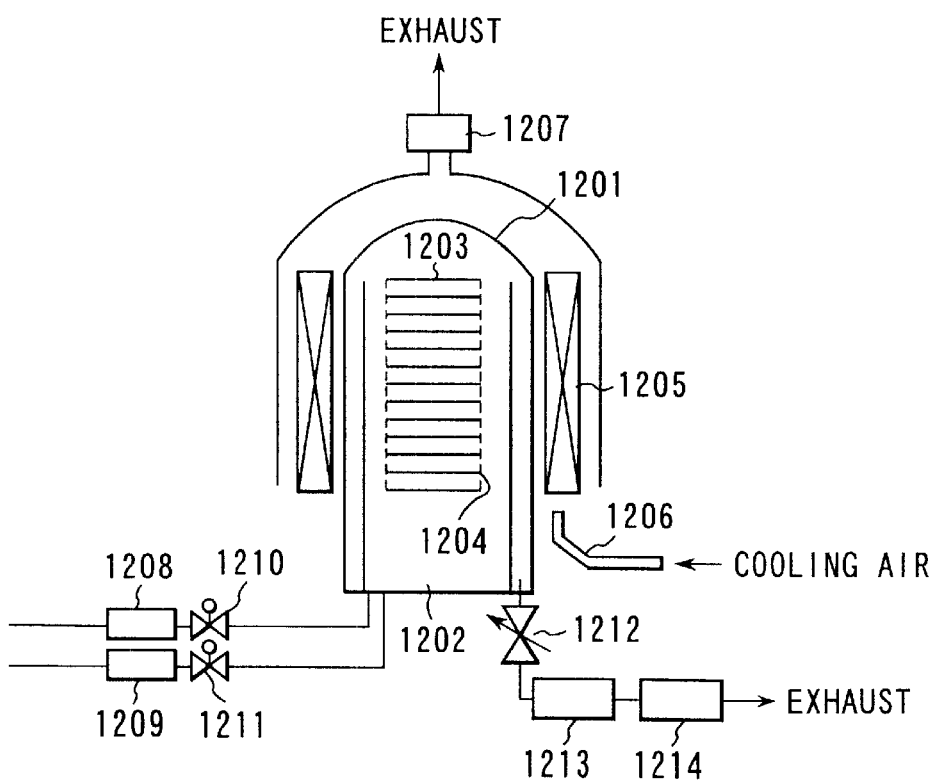
FIG. 19 is a diagram showing the etching amounts of Ba, Sr, and Ti in various etching methods of the 11th embodiment.
FIG. 20 is a schematic sectional view of a dry etching apparatus used in the 12th to 15th embodiments of the present invention.

The results are shown in FIG. 19. FIG. 19 shows the etching amounts, under the above temperature conditions, of metals Ba, Sr, and Ti constructing the thin BST film.

FIG. 19 demonstrates that only Ti in the thin BST film was etched by 500° C.-etching (3), and Ba and Sr were primarily etched by 820° C.-etching (4). Comparing the results of (3) and (4) with the results of (5) and (6) in which the etching time was prolonged shows that even when the etching time was increased, almost no difference was found between the etching amounts of each metal.

In contrast, the 20-nm thick BST film was completely etched in methods (1) and (2), indicating that a thin BST film can be completely dry-etched by two-stage etching.

Also, sections of substrates processed under conditions (1), (2), (3), and (4) were observed. Consequently, as shown in FIG. 18B, the thin BST film 103 was patterned under conditions (1) and (2). However, as shown in FIG. 18C, no big difference in shape from FIG. 18A was found in substrates processed under conditions (3) and (4). Using samples processed under conditions (3) and (4), the BST film 109 immediately below the opening in the silicon oxide film was evaluated by TEM-EDX. As a consequence, only Ba and Sr were detected as constituent elements in condition (3), and only Ti was detected in condition (4).

That is, by combining 500° C.-chlorine-etching capable of etching only Ti and 820° C.-etching almost unable to etch Ti but capable of etching Ba and Sr, a thin BST film containing these three metals can be completely dry-etched within a short time period. Also, no damages were found in the $SiO_2$ 1108 or 1107 exposed to $Cl_2$ gas, and no film thickness reduction was found. Furthermore, the quartz suscepter on which the substrates to be processed were mounted were examined, with the result that none of etched marks, flaws, and deposits were found.

Note that a thin BST film can be etched at a single etching temperature by properly selecting an etching temperature between 820° C. and 500° C. However, this etching temperature takes different values in accordance with the film composition of a thin BST film to be etched. Accordingly, etching residues easily form, or the actual temperature of a substrate to be processed on which a pattern of a semiconductor device is formed changes in accordance with this semiconductor device pattern. For this reason, an etching temperature must be set for each pattern on a wafer, and this decreases the process margin. In contrast, the method of the present invention can reliably etch a thin BST film of any composition.

By using an apparatus similar to that of this embodiment, etching of a three-layered structure of 20-nm thick SRO ($SrRuO_3$)/40-nm thick SBT ($Bi_2SrTa_2O_9$)/50-nm thick SRO was tried using a silicon oxide film as a mask. Consequently, the three-layered structure was completely etched by performing the first etching at 500° C. for 10 min and the second etching at 80° C. for 20 min under the same gas conditions as described above.

12TH EMBODIMENT

In the 12th embodiment, a cleaning method of the present invention is applied to a chemical vapor deposition (CVD) apparatus for depositing a BST film.

In cleaning of a reaction chamber of the BST film formation CVD apparatus of this embodiment, a thick BST film is etched by successively performing etching by which only Ti in the BST film is etched at a low temperature and etching by which Ba and Sr are etched at a high temperature.

As described in the 11th embodiment, when a BST film is etched under a single temperature condition, the etching temperature is very difficult to choose. This makes etching at a single temperature more difficult when a thick BST film is to be etched as when chamber cleaning is performed. This is so because the etching rates of Ba, Sr, and Ti constructing a BST film are different. For example, if the etching rates of Ba and Sr are high, Ti whose etching rate is low remains on the surface of a BST film during etching. This residual Ti interferes with outward diffusion of $BaCl_2$ and $SrCl_2$ gases from the BST film and thereby stops the etching.

FIG. 20 shows the arrangement of a hot wall batch furnace used in this embodiment. An inner tube 1202 is installed in a quartz reaction chamber 1201. A substrate boat 1204 mounting substrates 1203 to be processed on it is housed in the inner tube 1202. A heater 1205 is installed outside the reaction chamber 1201. As this heater 1205 for the reaction chamber, a small-heat-capacity heater suited to rapid heating and cooling is used. A quartz nozzle 1206 for cooling the heater 1205 by blowing a large amount of air against the heater 1205 is attached to the lower portion of the heater 1205. The reaction chamber temperature can be rapidly decreased by blowing cooling air from the quartz nozzle 1206 against the heater to exhaust hot air from an exhaust port 1207 in the upper portion of the quartz tube.

Chlorine of a cleaning gas and nitrogen of a diluent gas are supplied to the lower portion of the inner tube 1202 via mass-flow controllers 1208 and 1209 and valves 1210 and 1211. A supply system of gases ($Ba(THD)_2$, $Sr(THD)_2$, $Ti(i-OPr)_2(THD)_2$, and $O_2$ as source gases of BST) necessary to deposit a BST film is omitted from FIG. 20.

A vacuum pump 1213 is connected to the reaction chamber 1201 via a pressure adjusting valve 1212. The exhaust side of this vacuum pump 1213 is connected to an exhaust gas processor 1214 for exhausting the cleaning gas and the BST film depositing gas after making these gases harmless.

A cleaning method will be described below. First, substrates 1203 for BST film formation are mounted on the substrate boat 1204 and loaded into the reaction chamber 1201. To evaluate etching, each substrate 1203 was formed by forming a 100-nm thick silicon oxide film on the two entire surfaces by thermally oxidizing a silicon substrate.

Next, the pressure adjusting valve 1212 is opened to allow the vacuum pump 1213 to exhaust the reaction chamber 1201. At that time the set temperature in the reaction chamber is 300° C.

After the reaction chamber 1201 is well exhausted, the set temperature in the reaction chamber 1201 is increased to 450° C. When the temperature of the substrates 1203 becomes 450° C., $Ba(THD)_2$, $Sr(THD)_2$, and $Ti(i-OPr)_2(THD)_2$, and $O_2$ as BST film depositing gases and Ar as a diluent gas are supplied into the reaction chamber to start depositing a BST film. The flow rates of these source gases are so adjusted that the composition of a BST film to be deposited is $Ba_{0.5}Sr_{0.5}TiO_3$.

By film deposition for 5 min, a 20-nm thick BST film is formed on each substrate 1203. The deposition of this thin BST film is completed by stopping the supply of the source gases into the reaction chamber 1201. After the deposition is completed, to exhaust the residual gases in the reaction chamber 1201, evacuation and nitrogen purge are repeated to completely purge the residual gases. After the residual gases are well exhausted, the internal pressure of the reaction chamber 1201 is returned to normal pressure, and the substrates 1203 are unloaded. After this thin BST film deposition, deposition of a film containing Ba, Sr, Ti, and O was found in the reaction chamber 1201, the inner tube 1202, and the substrate boat 1204. The composition of the film was found to be $Ba_{0.5}Sr_{0.5}Ti_{1.5}O_{4-d}$ ($d \approx 0$), and the film thickness was found to be about 20 nm. This film formation sequence was repeated 50 times. As a consequence, a BST film with a film thickness of about 1 $\mu$m formed on the reaction chamber 1201, the inner tube 1202, the substrate 1203, and the substrate boat 1204.

Next, the apparatus is cleaned. First, the vacuum pump is used to exhaust the reaction chamber 1201. The heater 1203 is then used to heat portions to be cleaned, i.e., the reaction chamber 1201, the inner tube 1202, and the substrate boat 1204, to 500° C. necessary for the first etching.

Figure 21:
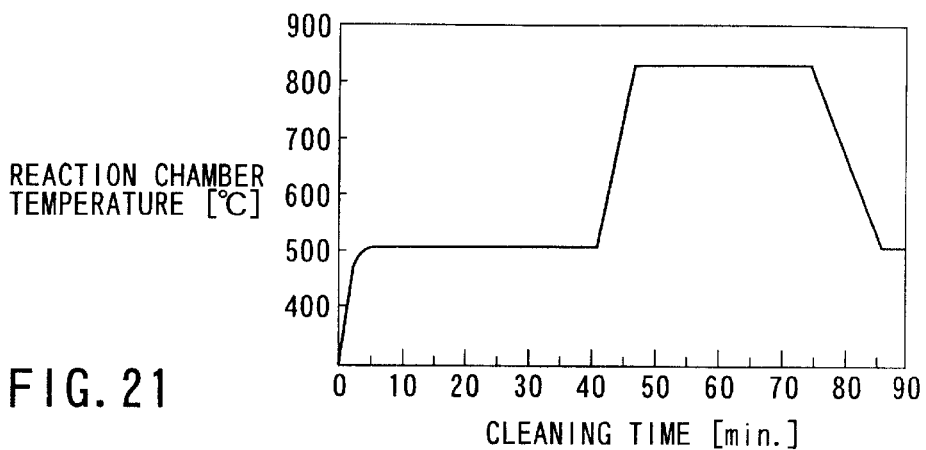
FIG. 21 is a graph showing the etching temperature profile of a cleaning method according to the 12th embodiment of the present invention.

Subsequently, the BST film is etched in accordance with a temperature profile as shown in FIG. 21. Nitrogen is first supplied into the reaction chamber at a flow rate of 3 SLM. The pressure adjusting valve is used to hold the internal pressure of the reaction chamber at 1.5 Torr, and the temperature in the reaction chamber is held at 500° C. After that, chlorine gas and nitrogen gas are supplied into the reaction chamber at flow rates of 2 SLM and 3 SLM, respectively, and the internal pressure of the reaction chamber is controlled to 1.5 Torr. In this state, the BST film is etched for 30 min.

Next, an etching gas is supplied. While the internal pressure of the reaction chamber is held at 1.5 Torr, the temperature in the reaction chamber is raised to 850° C. at a rate of 100° C./min and held at 850° C. for 30 min.

Then the supply of the chlorine gas is stopped. While the temperature in the reaction chamber is lowered at a rate of 50° C./min, evacuation of the reaction chamber 1201 and nitrogen purge are repeated to purge the residual chlorine gas in the reaction chamber. When the etching amount of the BST film on the thermally oxidized substrate 1203 was evaluated, the 1-$\mu$m thick BST film was found to be completely etched.

A mechanism by which a BST film is completely etched in this embodiment will be described below.

Figure 22:
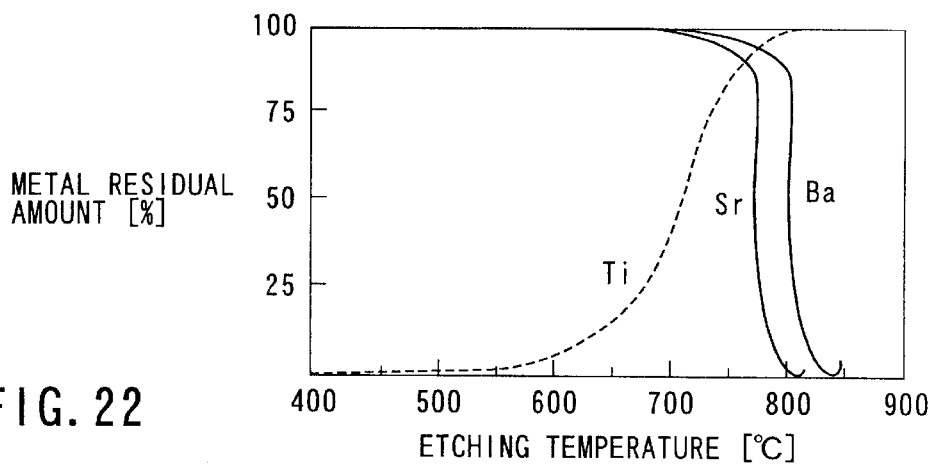
FIG. 22 is a graph showing the dependence of the residual etching amounts of Ba, Sr, and Ti on etching temperature in the 12th embodiment.

FIG. 22 shows the residual amounts of metal elements constructing a 1-$\mu$m thick BST film when a substrate on which this BST film was formed was etched under the aforementioned etching gas conditions while the etching temperature alone was changed from 400° C. to 900° C. As shown in FIG. 22, the etching characteristics of the constituent elements of a BST film depend on temperature to different degrees; Ti is easily etched at low temperatures, whereas Ba and Sr are easily etched at high temperatures.

That is, in this embodiment etching is first performed at 500° C. to selectively etch Ti in the BST film. 500° C. is selected because, as shown in FIG. 22, whether Ti in a 1-$\mu$m thick BST film is completely etched greatly depends upon the etching temperature. That is, the temperature must be lowered to 500° C. or less in order to etch a whole 1-$\mu$m thick BST film. 850° C. is chosen as the etching temperature for the second time since it is necessary to raise the reaction chamber temperature to 700° C. or more to etch Ba and Sr.

In this embodiment, a heater having a high heating rate of 100° C./min is used to allow smooth switching between the two etching temperatures.

13TH EMBODIMENT

In the 13th embodiment, the first etching by which Ti is primarily etched and the second etching by which Ba and Sr are primarily etched are repeated a plurality of times. In this method, it is unnecessary to completely etch a specific metal in a thick BST film by one-time etching, so the temperature of the first etching and the temperature of the second etching can be set at relative close values, e.g., 700° C. and 850° C. Accordingly, heating and cooling need only be performed in a relatively narrow temperature range, as compared with the 12th embodiment, and this shortens the times necessary for heating and cooling. As a consequence, etching can be performed within a short time period.

Also, when a very thick BST film is to be etched, it is difficult to completely etch only a specific metal (e.g., Ti) in the BST film by one-time etching. Therefore, the method of this embodiment in which a thick film is etched in stages is suitable.

The arrangement of an apparatus for conducting an etching experiment is the same as in FIG. 20. As in the 12th embodiment, after a 100-nm thick thermal oxide film is formed, a 1-$\mu$m thick BST film is formed. Then, the apparatus is cleaned. First, a vacuum pump is used to exhaust a reaction chamber 1201. A heater 1203 is then used to heat portions to be cleaned, i.e., the reaction chamber 1201, an inner tube 1202, and a substrate boat 1204, to 850° C. necessary for the first etching.

Figure 23:
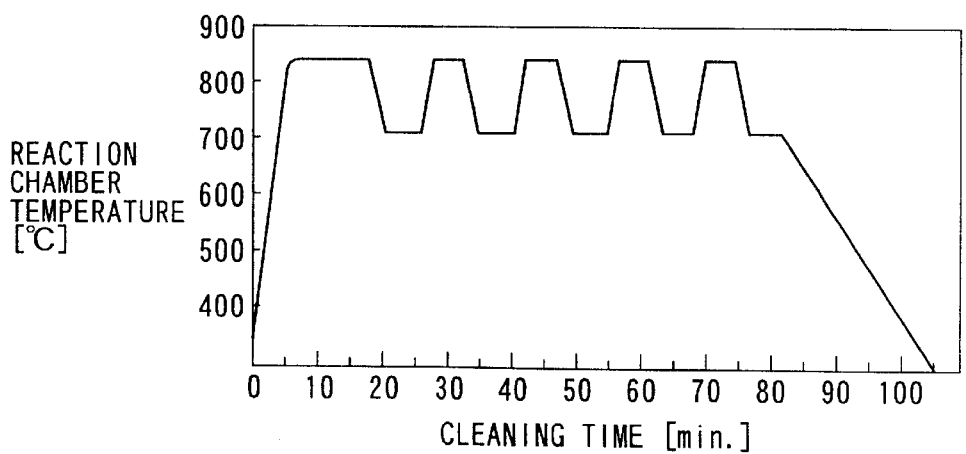
FIG. 23 is a view showing the etching temperature profile of a BST film cleaning method according to the 13th embodiment of the present invention.

Subsequently, the BST film is etched in accordance with a temperature profile as shown in FIG. 23.

Nitrogen is first supplied into the reaction chamber at a flow rate of 3 SLM. A pressure adjusting valve is used to hold the pressure at 1.5 Torr, and the temperature in the reaction chamber is held at 850° C. Chlorine gas and nitrogen gas are then supplied into the reaction chamber at flow rates of 2 SLM and 3 SLM, respectively. The internal pressure of the reaction chamber is controlled to 1.5 Torr, and etching is performed for 5 min in this state.

Next, an etching gas is supplied. While the internal pressure of the reaction chamber is controlled to 1.5 Torr, the temperature in the reaction chamber is lowered to 700° C. at a rate of 50° C./min, and etching is performed for 5 min at 700° C. After that, chlorine gas and nitrogen gas are supplied. While the internal pressure of the chamber is kept controlled to 1.5 Torr, the temperature in the reaction chamber 1201 is raised to 850° C. at a heating rate of 100° C./min. Following the same procedure as above, 850° C.-5 min etching and 700° C.-5 min etching are repeated five times.

Next, the supply of the chlorine gas is stopped. While the temperature in the reaction chamber is decreased to 300° C. at a rate of 20° C./min, evacuation of the reaction chamber 1201 and nitrogen purge are repeated to purge the residual chlorine gas in the reaction chamber. After the residual chlorine gas is completely purged, the temperature in the reaction chamber 1201 is stabilized at 300° C., and the internal pressure of the reaction chamber is returned to normal pressure. When the etching amount of the 1-$\mu$m thick BST film on the thermally oxidized substrate 1203 was evaluated, this 1-$\mu$m thick BST film was found to be completely etched.

A mechanism by which a BST film is completely etched in this embodiment will be described below.

Figure 24:
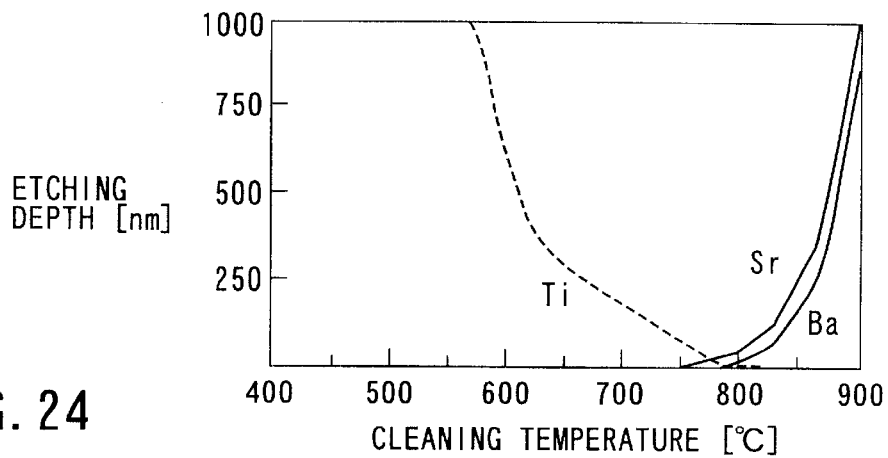
FIG. 24 is a view showing the dependence of the etching depths of Ba, Sr, and Ti on etching temperature when a thick BST film was etched with chlorine gas in the 13th embodiment.

FIG. 24 shows the dependence of the etching depths on etching temperature of metals Ba, Sr, and Ti constructing a 10-$\mu$m thick BST film, estimated from the etching amounts of these metals Ba, Sr, and Ti, when a quartz substrate on which this BST film was formed was etched in chlorine for 5 min. For example, at 850° C. the etching depth of Ti is 0 nm and the etching depths of Ba and Sr are 200 nm. This means that at 850° C. Ti is not etched at all but Ba and Sr are completely etched to a depth of 200 nm.

Figure 25A:
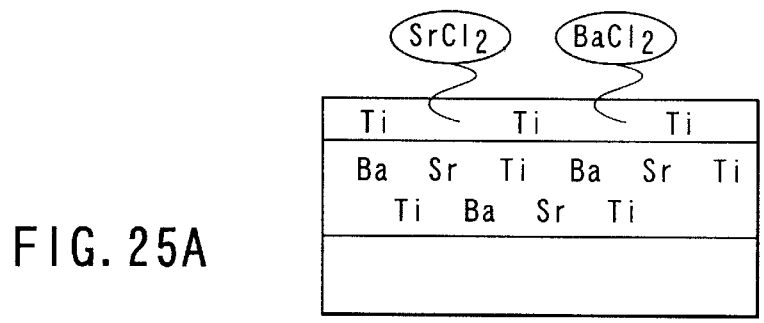
FIGS. 25A to 25C are views schematically showing the progress of etching in the 13th embodiment.
Figure 25B:
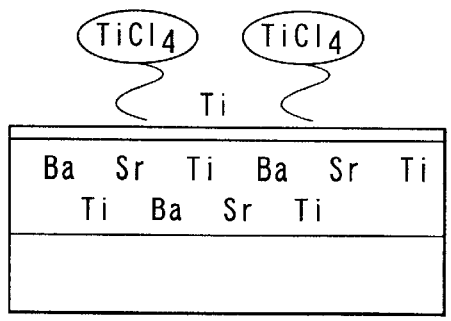
Figure 25C:
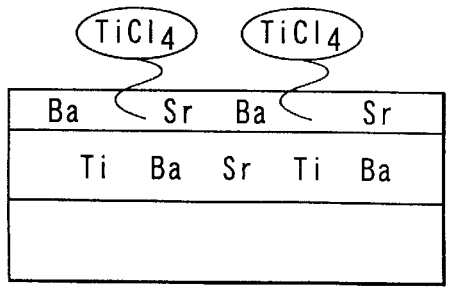

That is, in this embodiment etching is first performed at 850° C. to selectively etch, as shown in FIG. 25A, Ba and Sr in the 1-$\mu$m thick BST film to a depth of 200 nm from the surface. Next, etching is performed at 700° C. to completely etch Ti remaining on the surface (FIG. 25B). Furthermore, Ti to a depth of 150 nm from the surface of the remaining 800-nm thick BST film is completely etched, with the result that Ba and Sr remain on the surface (FIG. 25C). Following the same procedure, the high-temperature etching and the low-temperature etching are successively repeated to completely etch the thick BST film.

In this embodiment, a furnace having a high heating rate of 100° C./min and a high cooling rate of 50° C./min is used to allow the two etching temperatures to be switched within very short time periods.

14TH EMBODIMENT

In the 14th embodiment, a cleaning method of the present invention is applied to a BST film chemical vapor deposition (CVD) apparatus. In this method, the first etching using $ClF_3$ capable of completely etching Ti in a BST film and the second etching using chlorine capable of completely etching Ba and Sr are successively performed. This method etches a BST film, without ever changing the etching temperature, by using $ClF_3$ gas capable of etching Ti even in a high temperature region of 800° C. or more in which Ba and Sr can be etched.

The arrangement of an apparatus for conducting an etching experiment is basically the same as shown in FIG. 20. However, as an etching gas supply system, a line capable of supplying $ClF_3$ into an inner tube 1202 via a mass-flow controller and a valve is installed, in addition to that for chlorine, and similar to a chlorine line for supplying chlorine.

As in the 12th embodiment, substrates 1203 on each of which a 100-nm thick thermal oxide film and a 1-$\mu$m thick BST film are formed in this order are mounted on a substrate boat 1204 and loaded into a reaction chamber 1201. First, a vacuum pump is used to exhaust the reaction chamber 1201. A heater 1205 is then used to heat portions to be cleaned, i.e., the reaction chamber 1201, the inner tube 1202, and the substrate boat 1204, to 850° C. necessary for the first etching.

Figure 26:
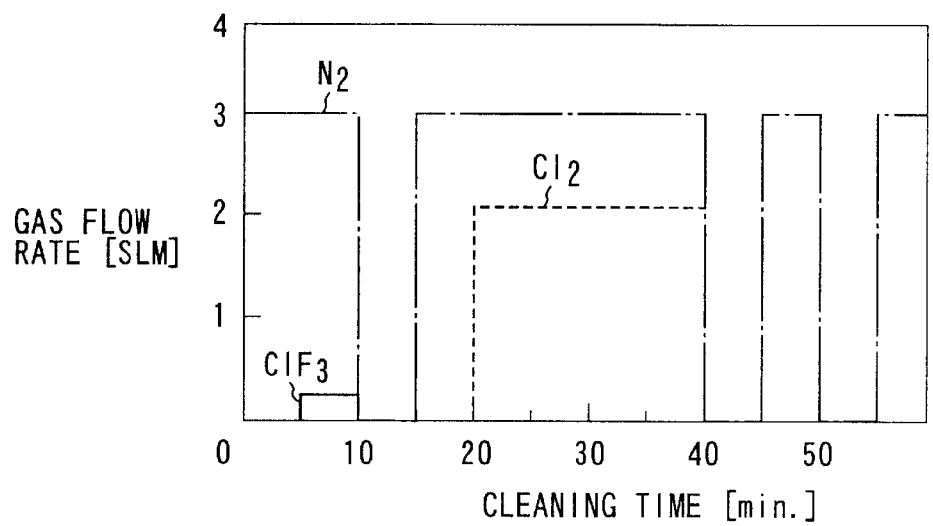
FIG. 26 is a graph showing the gas sequence of dry etching according to the 14th embodiment of the present invention.

Subsequently, the BST films are etched in accordance with a gas sequence as shown in FIG. 26. Initially, nitrogen is supplied into the reaction chamber at a flow rate of 3 SLM. The pressure is held at 1.5 Torr by using a pressure adjusting valve, and the temperature in the reaction chamber is held at 850° C.

Next, $ClF_3$ gas and nitrogen gas are supplied into the reaction chamber at flow rates of 100 sccm and 3 SLM, respectively, and the pressure is controlled to 1.5 Torr. In this state, etching is performed for 5 min. To suppress damages to quartz, the partial pressure of $ClF_3$ is 1/10 or less of the partial pressure of chlorine in the previous embodiments. By this etching, Ti in the 1-$\mu$m thick BST film is completely etched, and about 5% or less of the total amounts of Ba and Sr are etched. In the case of $ClF_3$ etching, when Ti in a BST film is completely etched, etching of Ba or Sr stops. Therefore, the etching amounts of Ba and Sr are at most about 5%.

The reaction chamber is then evacuated to exhaust the residual $ClF_3$ gas. Nitrogen gas is again supplied into the reaction chamber 1201 at a flow rate of 3 SLM. While the internal pressure of the reaction chamber is controlled to 1.5 Torr, purge is performed for 5 min. Next, chlorine gas and nitrogen gas are supplied into the reaction chamber at flow rates of 2 SLM and 3 SLM, respectively. Etching is performed for 20 min while the temperature in the reaction chamber is held at 850° C. By this etching, Ba and Sr in the remaining BST film are completely etched.

The supply of the chlorine gas is stopped. While the temperature in the reaction chamber is lowered to 300° C. at a rate of 50° C./min, evacuation of the reaction chamber 1201 and nitrogen purge are repeated to purge the residual chlorine gas in the reaction chamber. After the residual chlorine gas is completely purged, the temperature in the reaction chamber is stabilized at 300° C., and its internal pressure is returned to normal pressure. When the etching amount of the 1-µm thick BST film on the thermally oxidized substrate 1203 was evaluated, the 1-µm thick BST film was found to be completely etched.

The etching amount of the thermal oxide film on the substrate 1203 was also evaluated by an ellipsometer. Consequently, the thermal oxide film was etched by about 20 nm. Additionally, the substrate boat 1204 on which the substrates 1203 were mounted was examined, with the result that no clear quartz etching damages such as devitrification were observed.

15TH EMBODIMENT

In the 15th embodiment, a method of etching a BST film formed in a CVD reaction chamber by continuously increasing or decreasing the temperature in the reaction chamber will be described. Two-stage etching (the 12th embodiment) or multistage etching (the 13th embodiment) requires an enormous etching time unless a furnace heater has an excellent rapid heating/cooling characteristic. In the case of a furnace inferior in this heating/cooling characteristic, therefore, a method of etching which gradually changes the furnace temperature as in this embodiment is effective.

As an experimental apparatus, an apparatus (FIG. 20) similar to the one described in the 12th embodiment was used. As in the 12th embodiment, after a 100-nm thick thermal oxide film is formed, a 1-µm thick BST film is formed. Next, the apparatus is cleaned. First, a vacuum pump is used to exhaust a reaction chamber 1201. A heater 1205 is then used to heat portions to be cleaned, i.e., the reaction chamber 1201, an inner tube 1202, and a substrate boat 1204, to 500° C.

Figure 27:
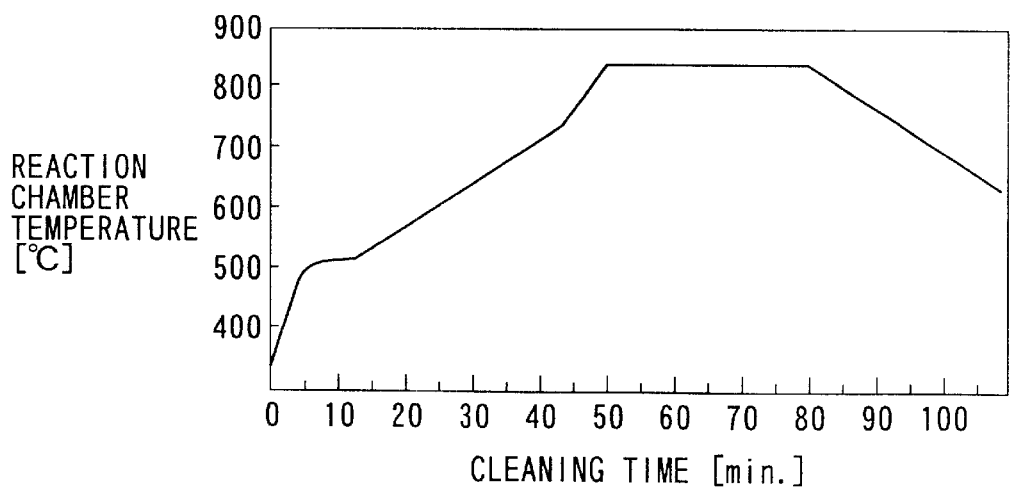
FIG. 27 is a graph showing the etching temperature profile of a dry etching method according to the 15th embodiment of the present invention.

Nitrogen is supplied into the reaction chamber at a flow rate of 3 SLM. A pressure adjusting valve is used to hold the internal pressure of the reaction chamber at 1.5 Torr, and the temperature in the reaction chamber is held at 500° C. After that, chlorine gas and nitrogen gas are supplied into the reaction chamber at flow rates of 2 SLM and 3 SLM, respectively, and the pressure is controlled to 1.5 Torr. In this state, in accordance with a temperature profile as shown in FIG. 27, the reaction chamber temperature is raised to 850° C. and held at 850° C. for 30 min, thereby etching the BST film.

The supply of the chlorine gas is then stopped. While the temperature in the reaction chamber is lowered to 300° C. at a rate of 10° C./min, evacuation of the reaction chamber 1201 and nitrogen purge are repeated to purge the residual chlorine gas in the reaction chamber. After the residual chlorine gas is completely purged, the temperature in the reaction chamber is stabilized at 300° C., and its internal pressure is returned to normal pressure. When the etching amount of the 1-µm thick BST film on the thermally oxidized substrates 1203 was evaluated, this 1-µm thick BST film was found to be completely etched.

This is presumable because, in this embodiment, in the process of heating from 500° C. Ti was etched first and then Ba and Sr were gradually etched, because only Ba and Sr remained when the temperature was held at 850° C., and because the residual Ba and Sr were completely etched by the etching at 850° C. for 30 min.

The present invention has been explained by using the embodiments and the comparative examples. One gist of the present invention is to use a halogen or halogen compound not containing fluorine in dry etching of a thin film containing alkaline-earth metals or in cleaning of a chemical vapor growth apparatus for forming a thin film containing alkaline-earth metals. Particularly chlorides, bromides, and iodides of alkaline-earth metals have relatively high vapor pressures compared to other alkaline-earth metal compounds, and the use of gases containing Cl, Br, and I is effective in etching.

Also, an oxide containing alkaline-earth metals except for Ti can be well etched by using an etching gas composed of a gas containing a halogen and a gas consisting of a halide of Ti.

When a halogen gas containing fluorine is to be used, damages to $SiO_2$ portions used in a film formation apparatus are prevented by coating these $SiO_2$ portions with a fluoride of an alkaline-earth metal.

Furthermore, the embodiments are explained by using a thin BST film as an example. However, the present invention is, of course, effective to thin films containing alkaline-earth metals such as $SrRuO_3$ and $SrBi_2Ta_2O_9$.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An etching method comprising the steps of:

preparing an oxide layer containing at least one alkaline-earth metal; and etching the oxide layer containing at least one alkaline-earth metal by using a plasma-free etching gas including a gas containing a halogen element and a gas containing a halide of Ti.

2. The etching method according to claim 1, wherein the step of etching the oxide layer includes a step of etching by using a gas containing at least fluorine as the gas containing a halogen element.

* * * * *